(12) United States Patent
Adam et al.

(10) Patent No.: US 9,059,323 B2
(45) Date of Patent: Jun. 16, 2015

(54) METHOD OF FORMING FIN-FIELD EFFECT TRANSISTOR (FINFET) STRUCTURE

(75) Inventors: Thomas N. Adam, Slingerlands, NY (US); Kangguo Cheng, Schenectady, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 13/565,838

(22) Filed: Aug. 3, 2012

(65) Prior Publication Data

US 2014/0038369 A1 Feb. 6, 2014

(51) Int. Cl.
*H01L 21/84* (2006.01)
*H01L 27/12* (2006.01)

(52) U.S. Cl.
CPC .......... *H01L 21/845* (2013.01); *H01L 27/1211* (2013.01)

(58) Field of Classification Search
CPC .......................... H01L 21/845; H01L 27/1211
USPC ....................................................... 438/157
See application file for complete search history.

(56) References Cited

U.S. PATENT DOCUMENTS

| 7,851,865 | B2 | 12/2010 | Anderson et al. |
| 2011/0210393 | A1 | 9/2011 | Chen et al. |
| 2011/0303983 | A1 | 12/2011 | Basker et al. |
| 2011/0309333 | A1 | 12/2011 | Cheng et al. |
| 2011/0316081 | A1 | 12/2011 | Chan et al. |
| 2012/0070947 | A1 | 3/2012 | Basker et al. |

OTHER PUBLICATIONS

U.S. Appl. No. 13/330,746, filed Dec. 20, 2011.
Maitra et al., "Agressively Scaled Strained-Silicon-On-Insulator Undoped-Body High-K/Metal-Gate nFinFETs for High-Performance Logic Applications", IEEE Electron Device Letters, vol. 32, No. 6, Jun. 2011.
Basker et al., "A 0.063 μm2 FinFET SRAM cell demonstration with conventional lithography using a novel integration scheme with agressively scaled fin and gate pitch", 2010 Symposium on VLSI Technology Digest of Technical Papers, 2010 IEEE.
Cheng et al., "Extremely Thin SOI (ETSOI) CMOS with Record Low Variability for Low Power System-on-Chip Applications", 2009 IEEE.

*Primary Examiner* — David Vu
(74) *Attorney, Agent, or Firm* — Katherine Brown; Hoffman Warnick LLC

(57) ABSTRACT

Various embodiments include methods of forming semiconductor structures. In one embodiment, a method includes: providing a precursor structure including a substrate and a set of fins overlying the substrate; forming a dummy epitaxy between the fins in the set of fins; masking a first group of fins in the set of fins and the dummy epitaxy between the first group of fins in the set of fins; removing the dummy epitaxy to expose a second group of the fins; forming a first in-situ doped epitaxy between the exposed fins; masking the second group of fins in the set of fins and the in-situ doped epitaxy between the second group of fins in the set of fins; unmasking the first group of fins; removing the dummy epitaxy layer between the first group of fins to expose of the first group of fins; and forming a second in-situ doped epitaxy between the exposed fins.

20 Claims, 32 Drawing Sheets

US 9,059,323 B2

METHOD OF FORMING FIN-FIELD EFFECT TRANSISTOR (FINFET) STRUCTURE

FIELD

The subject matter disclosed herein relates to semiconductor structures. More specifically, the subject matter disclosed herein relates to forming of semiconductor structures.

BACKGROUND

It has been discovered that the performance of a fin-shaped field effect transistor (or, fin-FET) and extremely thin silicon-on-insulator (or, ETSOI) semiconductor hardware can be improved with in-situ doped epitaxy and implant-free processes. However, integrating dual in-situ doped epitaxy for complementary metal oxide semiconductor (or, CMOS) structures can be a challenge for non-planar structures such as finFETs, tri-gate, and nanowire structures.

In particular, a hardmask is used to selectively grow the epitaxy in either the n-type field effect transistor (nFET) or the p-type FET (pFET) regions, while protecting the other device polarity (e.g., the other one of the nFET or the pFET). In order to improve device performance, the dielectric layer between the in-situ doped epitaxy layer and the channel (typically first spacer) is thinned as much as possible. In the current ETSOI CMOS process flow, a dielectric layer serves as the spacer on one device (e.g., nFET or pFET) polarity, while protecting the other device (the other one of the nFET or pFET) polarity during the epitaxy process.

A drawback of using this approach on non-planar finFET structures is that the process involves two separate spacer formation steps for nFET and pFET. These steps can complicate the formation of the finFET, as it may be challenging to remove the spacer material from fin sidewalls while retaining spacer material on gate sidewalls.

One conventional approach to address this issue is to utilize another hardmask layer, such as an oxide, to protect one device polarity during epitaxy on the other device. This approach, however, has disadvantages. For example, this approach involves using a thick dielectric layer due to the higher etch rate of oxide during epitaxy pre-clean. The use of a thicker dielectric creates patterning difficulties as the spacing between the transistors is made smaller in the future technology nodes. As such, these conventional approaches fail to address the above-noted deficiencies.

BRIEF SUMMARY

Various embodiments disclosed include methods of forming semiconductor structures. In one embodiment, a method includes: providing a precursor structure including a substrate and a set of fins overlying the substrate; forming a dummy epitaxy layer between the fins in the set of fins; forming a dielectric over the dummy epitaxy layer and the set of fins; forming a first mask over a first portion of the dielectric, leaving a second portion of the dielectric exposed; removing the second portion of the dielectric and the dummy epitaxy layer under the second portion of the dielectric to expose fins under the second portion of the dielectric; forming a first in-situ doped epitaxy between the exposed fins; forming a shielding dielectric over the in-situ doped epitaxy and the exposed fins; forming a second mask over the shielding dielectric; removing the first portion of the dielectric and the dummy epitaxy layer under the first portion of the dielectric to expose fins under the first portion of the dielectric; forming a second in-situ doped epitaxy between the exposed fins under the first portion of the dielectric; and removing the shielding dielectric over the in-situ doped epitaxy and the exposed fins.

A first aspect of the invention includes a method including: providing a precursor structure including a substrate and a set of fins overlying the substrate; forming a dummy epitaxy layer between the fins in the set of fins; forming a dielectric over the dummy epitaxy layer and the set of fins; forming a first mask over a first portion of the dielectric, leaving a second portion of the dielectric exposed; removing the second portion of the dielectric and the dummy epitaxy layer under the second portion of the dielectric to expose fins under the second portion of the dielectric; forming a first in-situ doped epitaxy between the exposed fins; forming a shielding dielectric over the in-situ doped epitaxy and the exposed fins; forming a second mask over the shielding dielectric; removing the first portion of the dielectric and the dummy epitaxy layer under the first portion of the dielectric to expose fins under the first portion of the dielectric; forming a second in-situ doped epitaxy between the exposed fins under the first portion of the dielectric; and removing the shielding dielectric over the in-situ doped epitaxy and the exposed fins.

A second aspect of the invention includes a method including: providing a precursor structure including a substrate and a set of fins overlying the substrate; forming a dummy epitaxy layer between the fins in the set of fins; masking a first group of fins in the set of fins and the dummy epitaxy layer between the first group of fins in the set of fins; removing the dummy epitaxy layer to expose a second group of the fins; forming a first in-situ doped epitaxy between the exposed fins; masking the second group of fins in the set of fins and the in-situ doped epitaxy between the second group of fins in the set of fins; unmasking the first group of fins; removing the dummy epitaxy layer between the first group of fins to expose of the first group of fins; and forming a second in-situ doped epitaxy layer between the exposed fins.

A third aspect of the invention includes a method including: forming a set of fins over a substrate; forming a gate stack over the set of fins; selectively forming a spacer structure over sidewalls of the gate stack, leaving sidewalls of each fin exposed; forming a dummy epitaxy layer between the fins in the set of fins, the dummy epitaxy layer contacting the exposed sidewalls of each exposed fin; forming a dielectric over the dummy epitaxy layer and the set of fins; forming a first mask over a first portion of the dielectric, leaving a second portion of the dielectric exposed; removing the second portion of the dielectric and the dummy epitaxy layer under the second portion of the dielectric to expose fins under the second portion of the dielectric; forming a first in-situ doped epitaxy between the exposed fins; forming a shielding dielectric over the in-situ doped epitaxy and the exposed fins; forming a second mask over the shielding dielectric; removing the first portion of the dielectric and the dummy epitaxy layer under the first portion of the dielectric to expose fins under the first portion of the dielectric; forming a second in-situ doped epitaxy between the exposed fins under the first portion of the dielectric; and removing the shielding dielectric over the in-situ doped epitaxy and the exposed fins.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 4A illustrates a cross-sectional schematic view through the channel region of a precursor structure, while

FIGS. 5A-12A depict cross-sectional schematic views through the source-drain region of a precursor structure, excluding illustration of a spacer structure; FIGS. 5B-12B show cross-sectional views in the channel direction through the fin of the respective structures of FIGS. 5A-12A; and FIGS. 5C-12C show cross-sectional views of the structures of FIGS. 5A-12A, respectively, through the region between fins (in the channel direction), all according to various embodiments of the invention.

Figure 1:
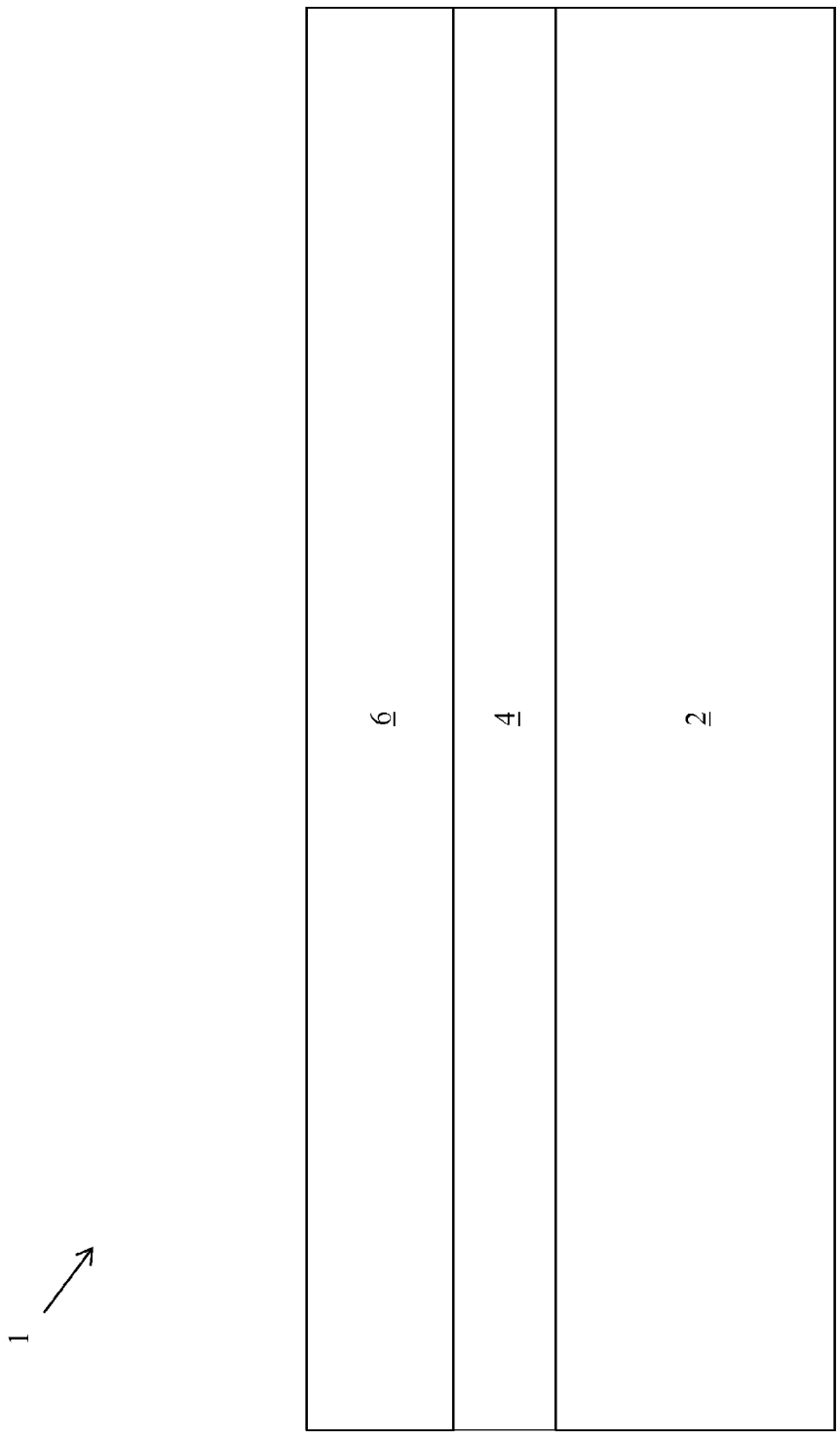
FIGS. 1-3 depict cross-sectional schematic views of precursor semiconductor structures, cross-sectioned through the channel region, undergoing processes according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit structures. More specifically, the subject matter disclosed herein relates to forming of integrated circuit structures and the structures so formed.

As described herein, a drawback of the conventional approaches of forming non-planar finFET structures is that the conventional process involves two separate spacer formation steps for nFET and pFET. These steps can complicate the formation of the finFET, as it may be challenging to remove the spacer material from fin sidewalls while retaining spacer material on gate sidewalls.

As further described herein, a conventional approach to address this issue is to utilize another hardmask layer, such as an oxide, to protect one device polarity during epitaxy on the other device. This approach, however, has disadvantages. For example, this approach involves using a thick dielectric layer due to the higher etch rate of oxide during epitaxy pre-clean. As such, these conventional approaches fail to address the above-noted deficiencies.

In contrast to these conventional approaches, various embodiments of the invention include processes of forming semiconductor structures by utilizing a dummy epitaxy material to postpone the process of dual epitaxy formation in the n-type FET region and the p-type FET region of a semiconductor structure (e.g., a metal oxide semiconductor FET, or MOSFET) to a later point in the wafer processing when the source and drain of the device are substantially planar.

A first particular aspect of the invention includes a method including: providing a precursor structure including a substrate and a set of fins overlying the substrate; forming a dummy epitaxy layer between the fins in the set of fins; forming a dielectric over the dummy epitaxy layer and the set of fins; forming a first mask over a first portion of the dielectric, leaving a second portion of the dielectric exposed; removing the second portion of the dielectric and the dummy epitaxy layer under the second portion of the dielectric to expose fins under the second portion of the dielectric; forming a first in-situ doped epitaxy between the exposed fins; forming a shielding dielectric over the in-situ doped epitaxy and the exposed fins; forming a second mask over the shielding dielectric; removing the first portion of the dielectric and the dummy epitaxy layer under the first portion of the dielectric to expose fins under the first portion of the dielectric; forming a second in-situ doped epitaxy between the exposed fins under the first portion of the dielectric; and removing the shielding dielectric over the in-situ doped epitaxy and the exposed fins.

A second particular aspect of the invention includes a method including: providing a precursor structure including a substrate and a set of fins overlying the substrate; forming a dummy epitaxy layer between the fins in the set of fins; masking a first group of fins in the set of fins and the dummy epitaxy layer between the first group of fins in the set of fins; removing the dummy epitaxy layer to expose a second group of the fins; forming a first in-situ doped epitaxy layer between the exposed fins; masking the second group of fins in the set of fins and the first in-situ doped epitaxy layer between the second group of fins in the set of fins; unmasking the first group of fins; removing the dummy epitaxy layer between the first group of fins to expose of the first group of fins; and forming a second in-situ doped epitaxy layer between the exposed fins.

A third particular aspect of the invention includes a method including: forming a set of fins over a substrate; forming a gate stack over the set of fins; selectively forming a spacer structure over sidewalls of the gate stack, leaving sidewalls of each fin exposed; forming a dummy epitaxy layer between the fins in the set of fins, the dummy epitaxy layer contacting the exposed sidewalls of each exposed fin; forming a dielectric over the dummy epitaxy layer and the set of fins; forming a first mask over a first portion of the dielectric, leaving a second portion of the dielectric exposed; removing the second portion of the dielectric and the dummy epitaxy layer under the second portion of the dielectric to expose fins under the second portion of the dielectric; forming a first in-situ doped epitaxy between the exposed fins; forming a shielding dielectric over the in-situ doped epitaxy and the exposed fins; forming a second mask over the shielding dielectric; removing the first portion of the dielectric and the dummy epitaxy layer under the first portion of the dielectric to expose fins under the first portion of the dielectric; forming a second in-situ doped epitaxy between the exposed fins under the first portion of the dielectric; and removing the shielding dielectric over the in-situ doped epitaxy and the exposed fins.

Turning to FIGS. 1-12C, schematic cross-sectional views (distinct views shown) of precursor semiconductor structures are shown undergoing processes according to various embodiments of the invention. FIGS. 13A-13C show respective views of a semiconductor structure formed after completion of those processes.

Turning particularly to FIG. 1, a first process of providing a precursor semiconductor structure 1 is illustrated. The precursor semiconductor structure 1 can include a silicon-on-insulator (SOI) structure including substrate 2, buried oxide layer 4, and SOI layer 6 for embodiments that include a finFET structure built on an SOI precursor. Other embodiments can include a finFET structure built on a bulk silicon substrate in which case layers 2, 4, and 6 of FIG. 1 could be replaced by a single substrate (e.g., substrate 2). In this case, the substrate 2 can include any material described herein. One having skill in the art can comprehend the distinctions between the SOI structure shown and the bulk silicon alternative such that further illustration of the processes described herein using bulk silicon is not necessary.

Returning to FIG. 1, in the embodiments shown, the precursor semiconductor structure 1 can include a substrate 2, which can include any conventional semiconductor substrate material including but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 2 may be strained.

Overlying the substrate 2 is a buried oxide layer 4, which can be formed of any conventional oxide material, e.g., silicon dioxide ($SO_2$). Overlying the buried oxide layer 4 is a silicon-on-insulator (SOI) layer 6, which can include silicon, silicon germanium, or any suitable semiconductor. The SOI layer 6 can be formed over the buried oxide layer 4, and the buried oxide layer 4 can be formed over the substrate 2, respectively, according to conventional techniques, e.g., masking, etching, deposition, etc. prior to the processes described according to the various embodiments of the invention. As used herein, and unless otherwise noted, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
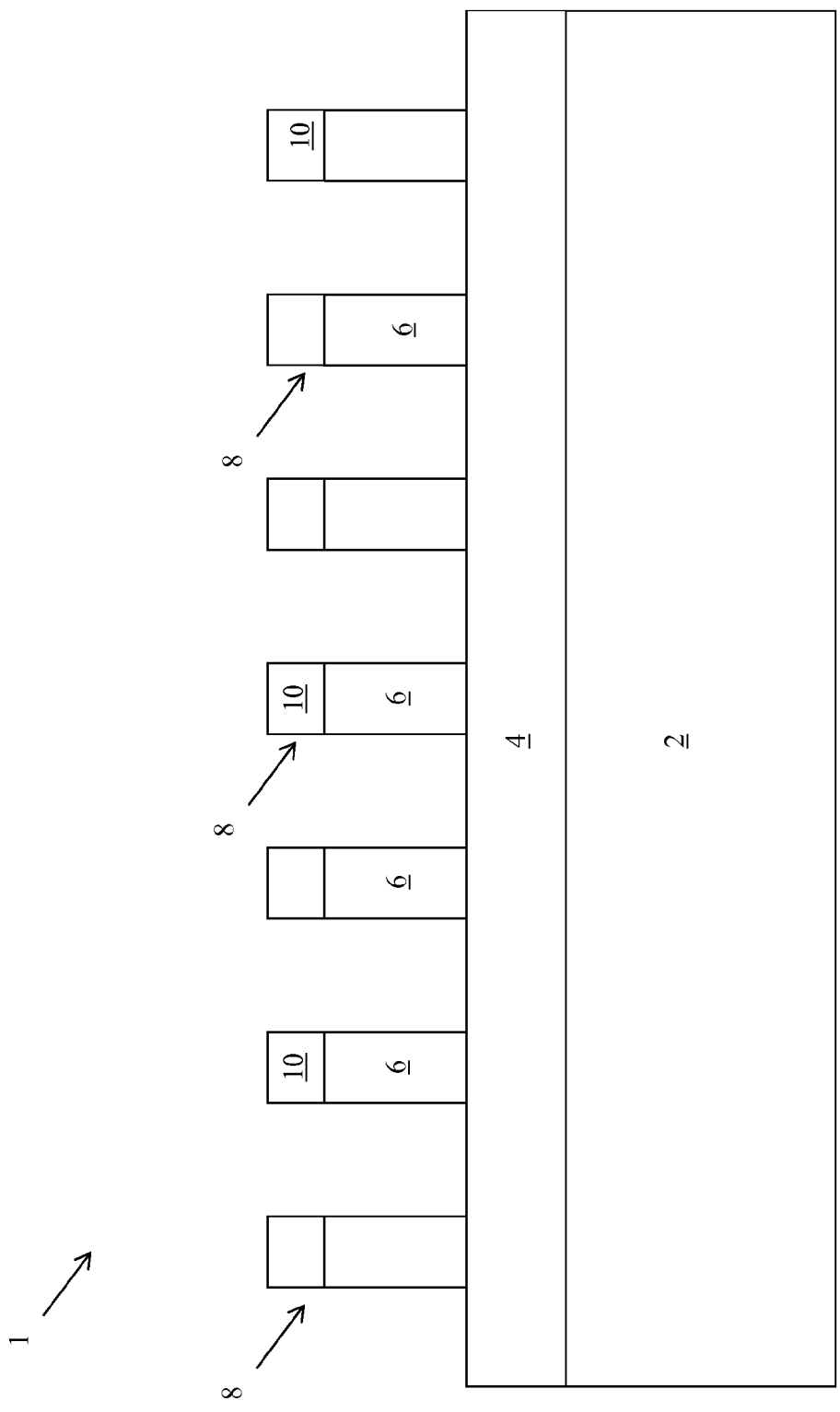

FIG. 2 illustrates a process according to various embodiments of the invention, which can include forming a set of fins 8 overlying the substrate 2 (more particularly, overlying the buried oxide layer 4). The set of fins 8 can be formed from the SOI layer 6, e.g., via conventional etching and masking techniques known in the art and/or described herein. Overlying each fin 8 is a hard mask 10, which can be formed according to known techniques to shield each fin 8 in the set of fins 8 during subsequent processing steps. It is understood that use of the hard mask 10 over each fin 8 is optional in some embodiments. Where the hard mask 10 is not employed over each fin 8, the later formed gate will wrap around each fin 8 to form a tri-gate structure, which is known in the art. In other alternatives, e.g., a nanowire embodiment, the gate can wrap around and underneath each fin 8.

Figure 3:
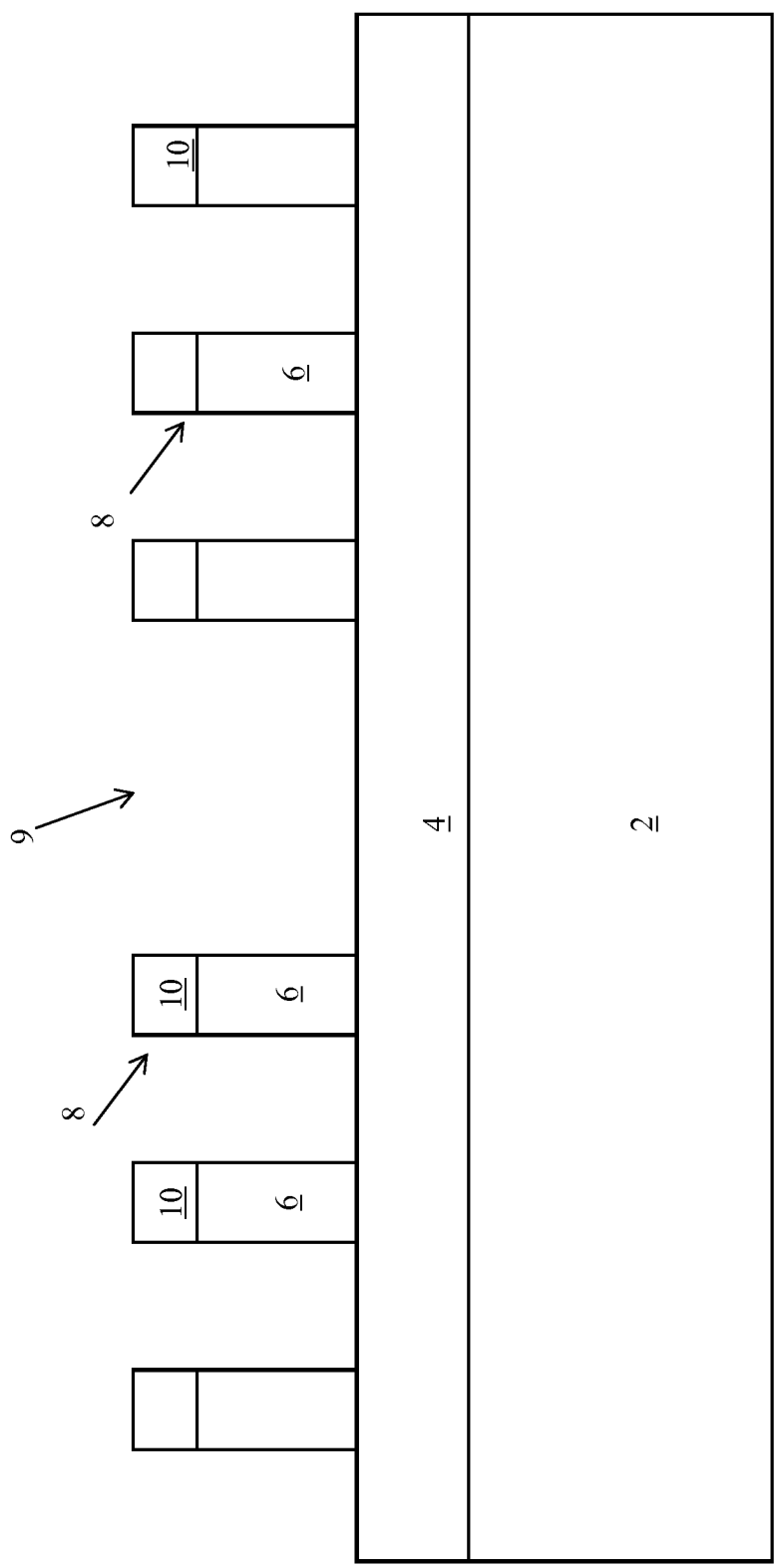

FIG. 3 illustrates a process according to various embodiments of the invention, which can include forming a gap 9 between two sub-sets of fins 8 in the set of fins 8. Forming the gap 9 can include removing a fin 8 approximately near a center of the set of fins 8 to form two separate sub-sets of fins 8.

Figure 4A:
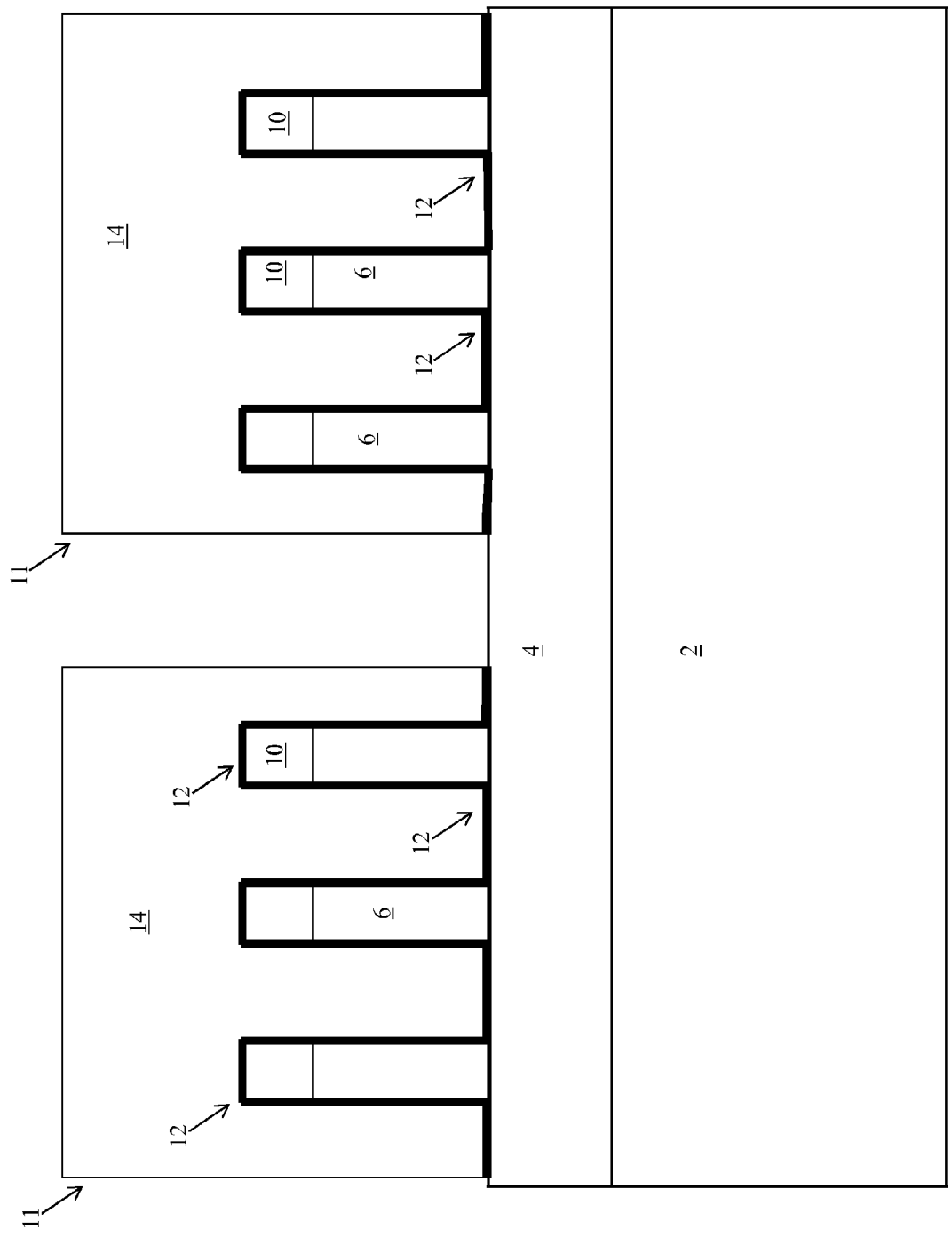
Figure 4B:
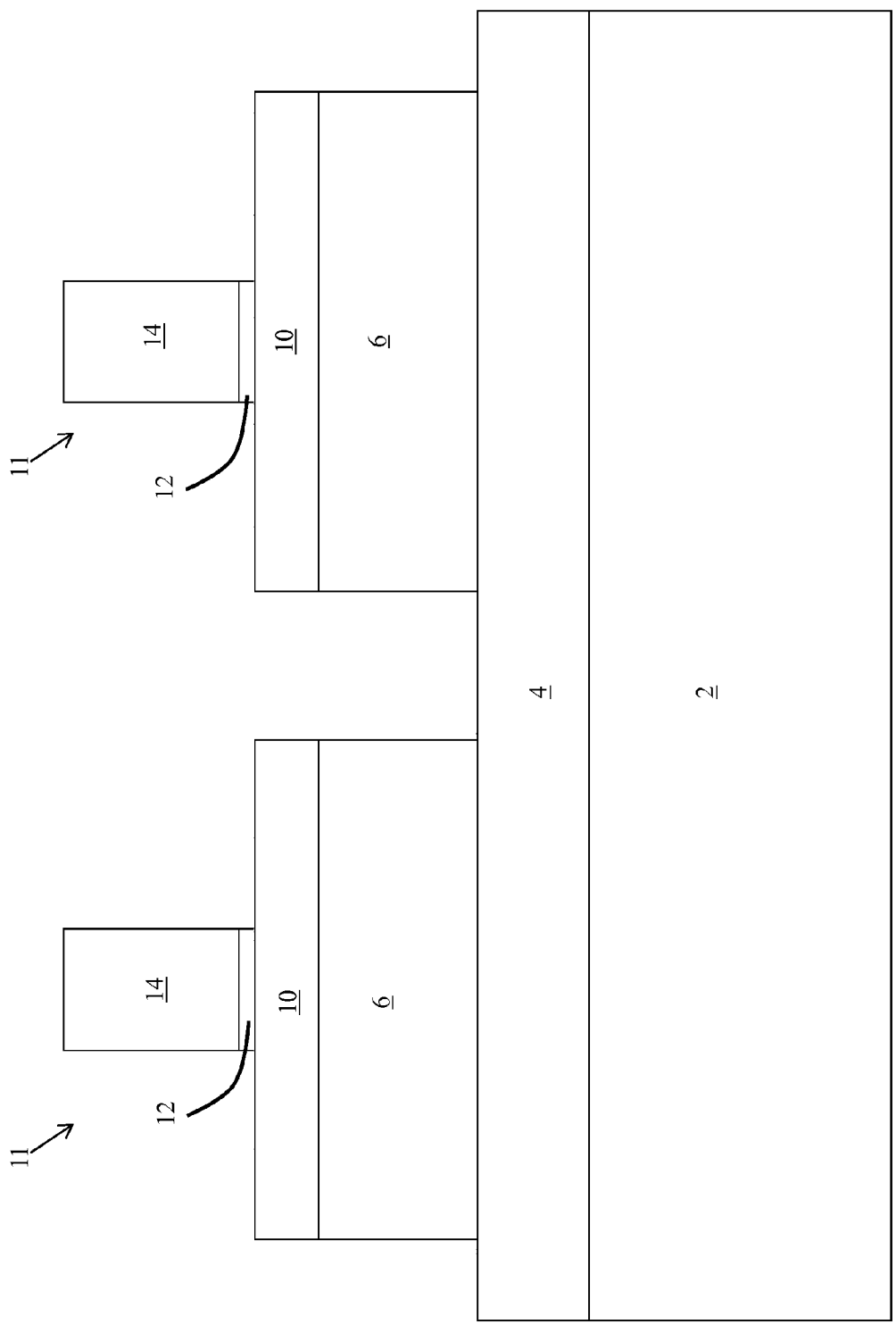
FIG. 4B illustrates a cross-sectional view through a fin in the direction of the channel region in the precursor structure, according to various embodiments of the invention.

FIGS. 4A-4B illustrates a process according to various embodiments of the invention, which can include forming a gate stack 11 over the hard mask 10, the set (sub-sets) of fins 8 and the exposed portion of the buried oxide layer 4. The gate stack 11 can include a gate dielectric 12, and a gate electrode 14 overlying the gate dielectric 12. The gate stack 11 can be formed by any deposition technique known in the art and/or described herein. FIG. 4A illustrates a cross-sectional view through the channel region of the structure, while FIG. 4B illustrates a cross-sectional view through a fin 8 in the direction of the channel region. It is understood that the gate stack 11 can act as an actual (final) gate stack in the gate-first process flow, or alternatively, as a dummy gate stack which is later replaced with an actual gate stack later in time (in a gate-last process flow).

Figure 5A:
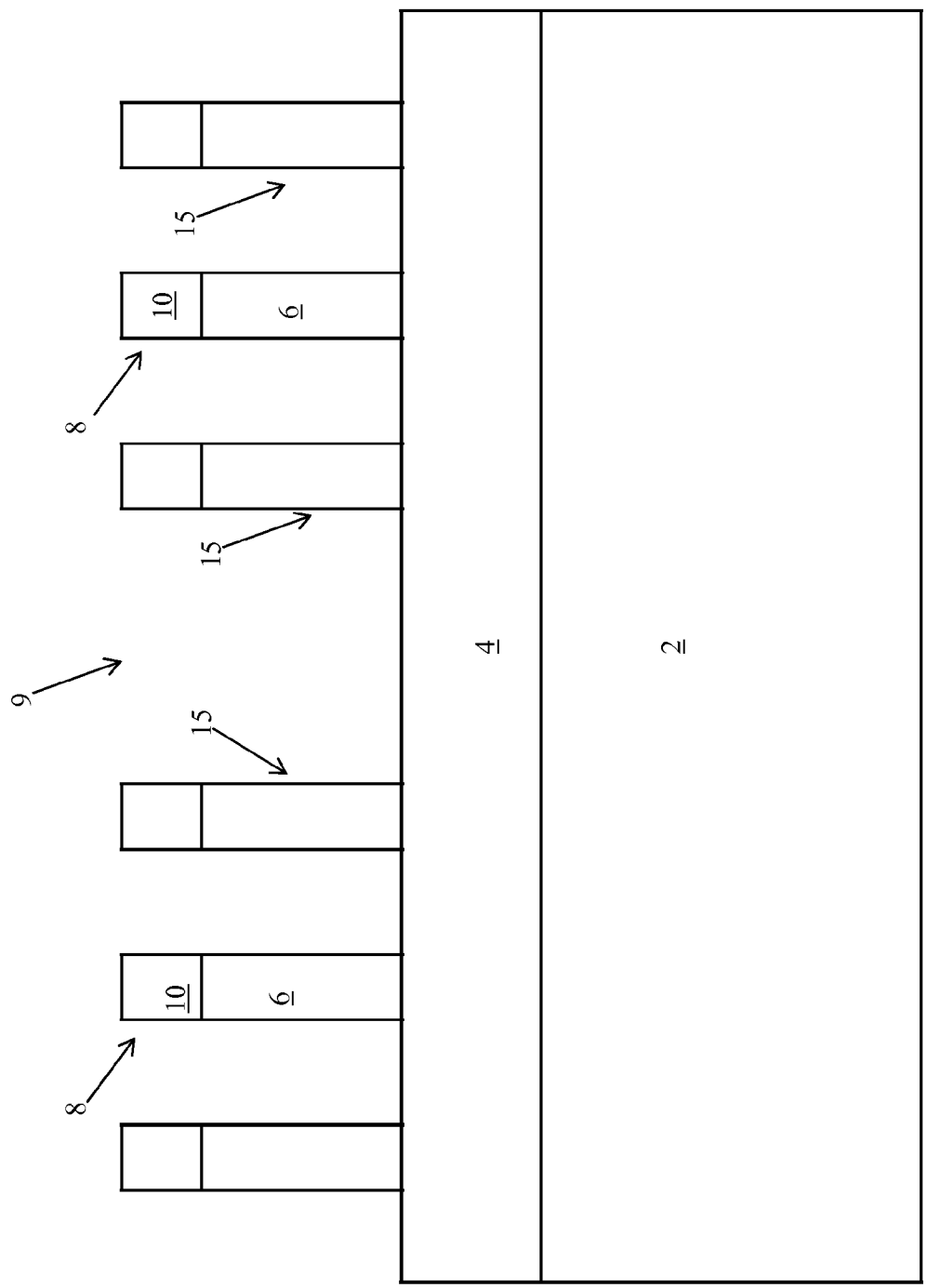
Figure 5B:
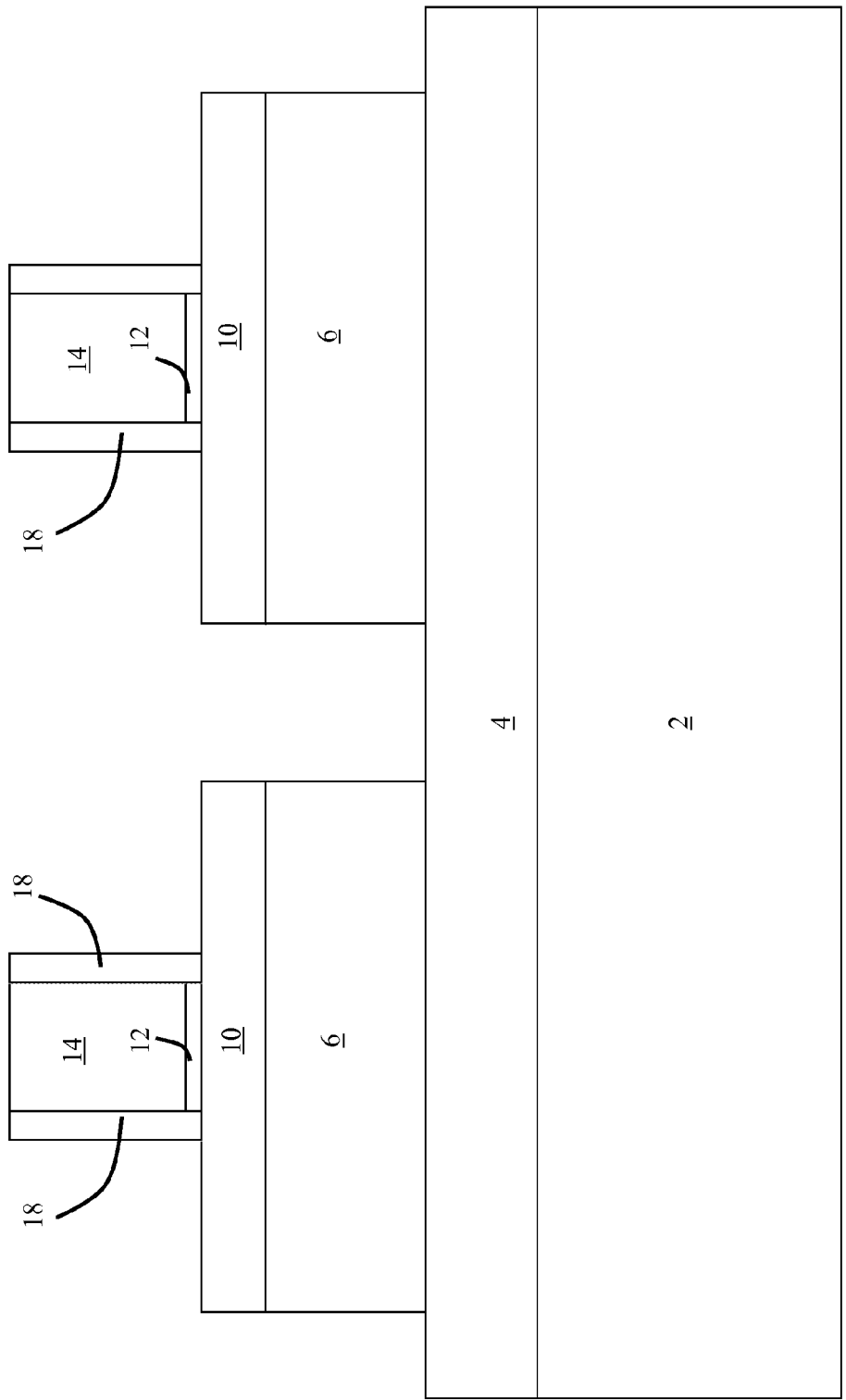
Figure 5C:
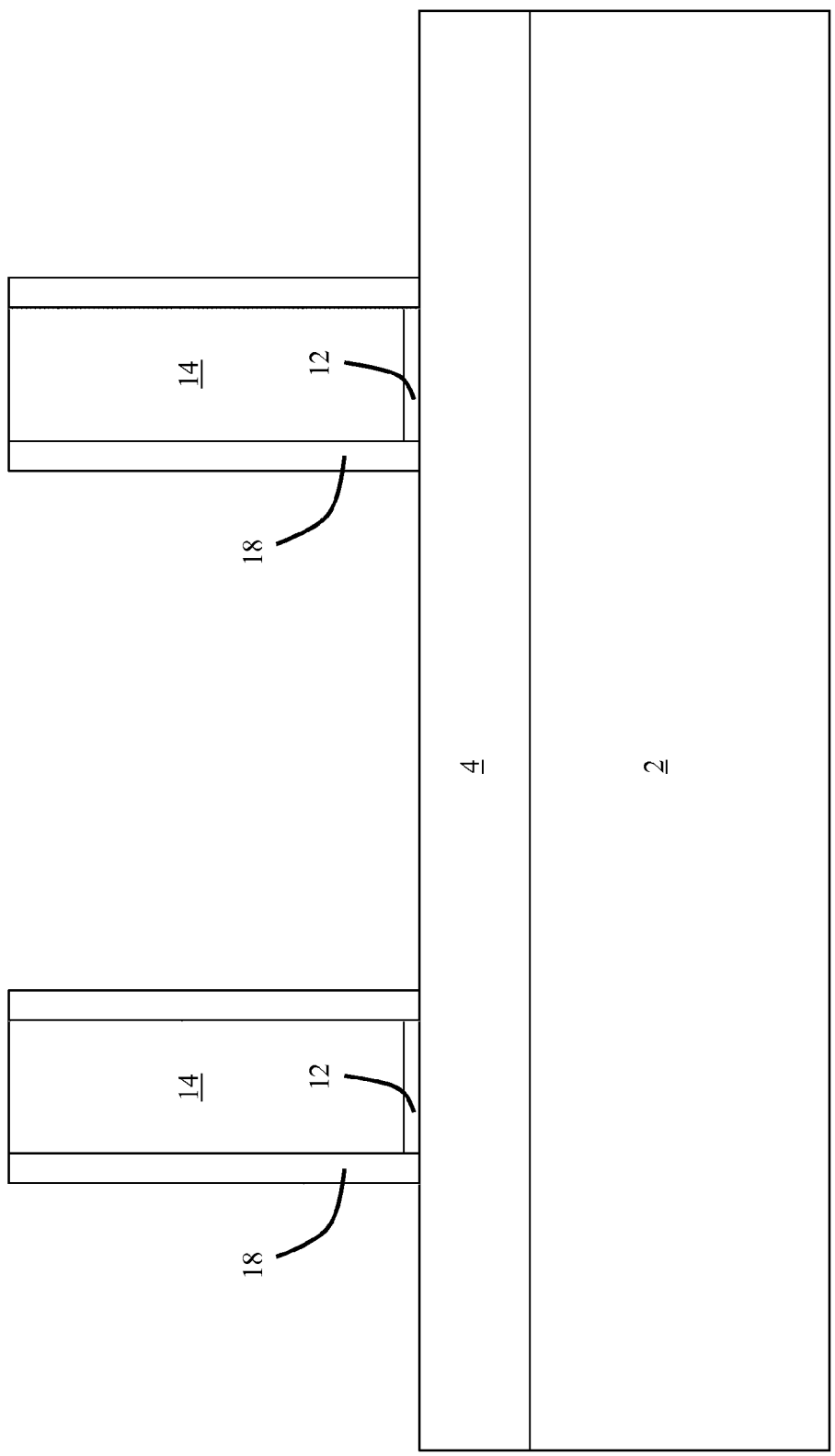

FIGS. 5A-5C illustrate a process according to various embodiments of the invention, which can include selectively forming a spacer structure 18 over sidewalls of the gate stack 11 (in particular, the gate electrode 14), leaving sidewalls 15 of each fin 8 exposed. The spacer structure 18 can be formed by any selective deposition technique known in the art. FIG. 5A shows a cross-sectional view through the source-drain region of the structure, and does not illustrate the spacer structure 18. FIG. 5B shows a cross-sectional view in the channel direction through the fin 8. FIG. 5C shows a cross-sectional view of the structure through the region between fins 8 (in the channel direction).

For ease of understanding of the various aspects of the invention, the views depicted in FIGS. 5A, 5B, and 5C, respectively, are followed in each respective group of figures. That is, FIGS. 6A, 7A, 8A, etc. depict the structure undergoing processes from a cross-sectional view through the source-drain region of the structure. Similarly, FIGS. 6B, 7B, 8B, etc. depict the structure undergoing the same processes as described with reference to respective FIGS. 6A, 7A, 8A, etc., except that FIGS. 6B, 7B, 8B, etc. depict the structure cross-sectionally through the fin 8 in the channel direction.

Figure 6A:
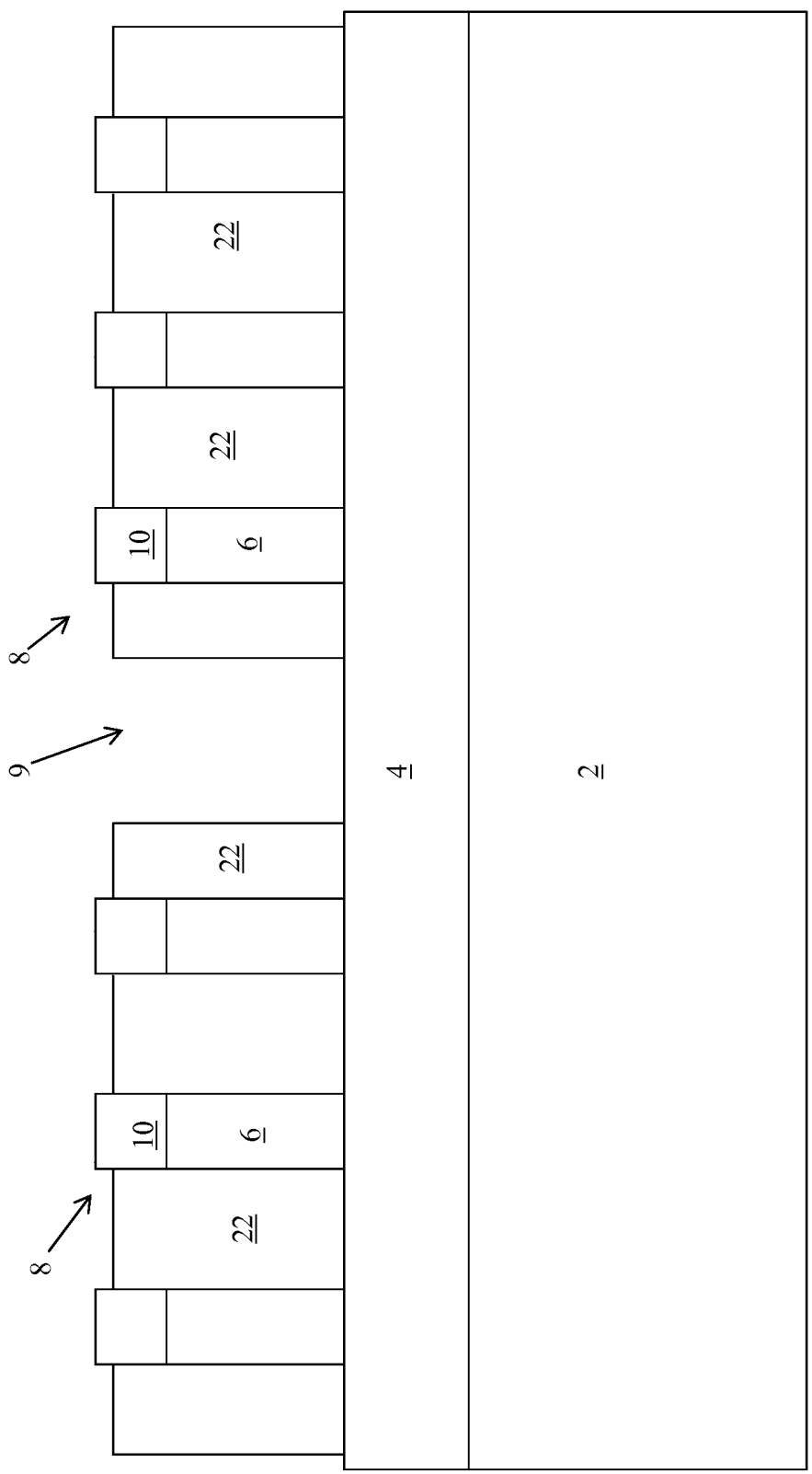
Figure 6B:
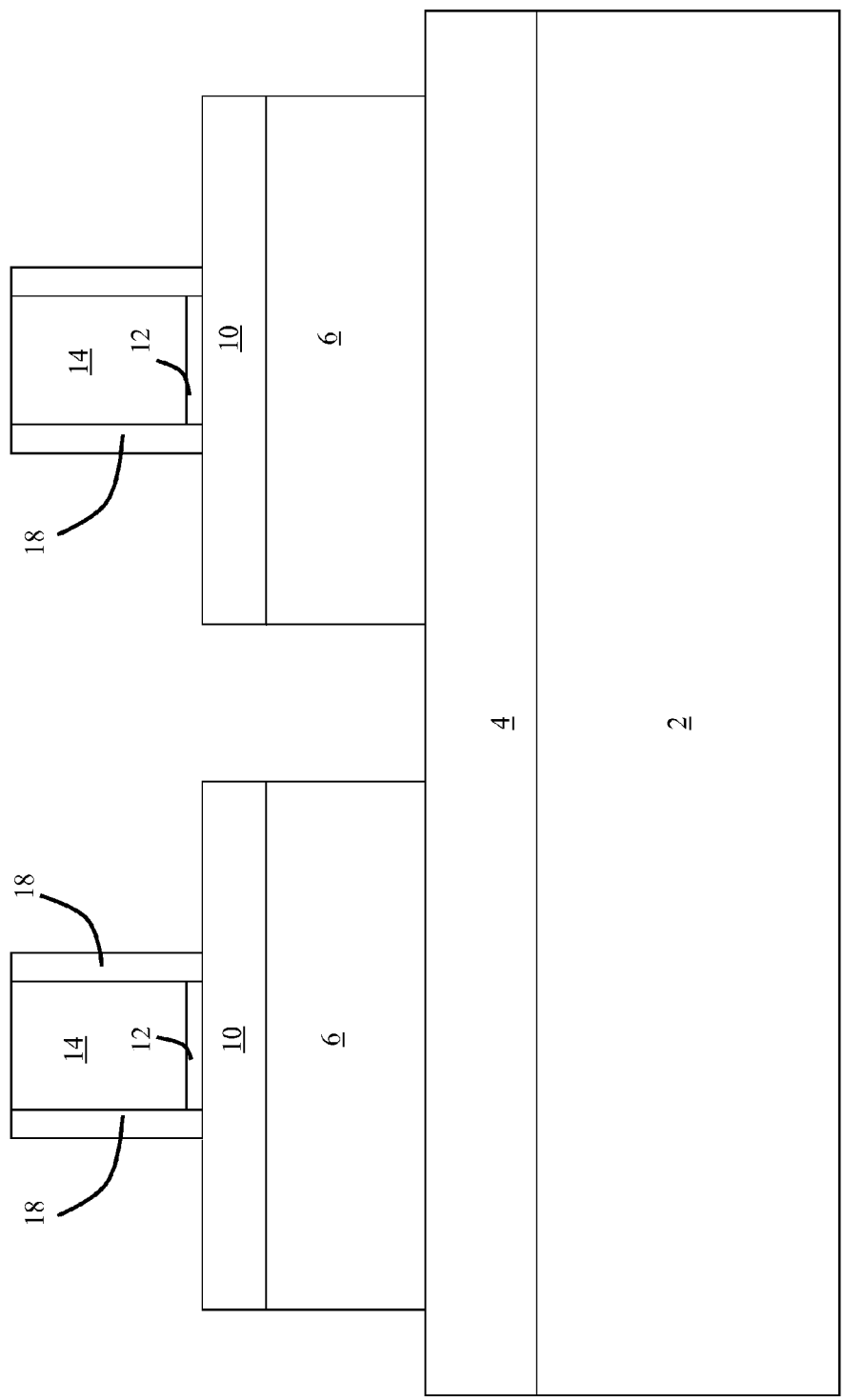
Figure 6C:
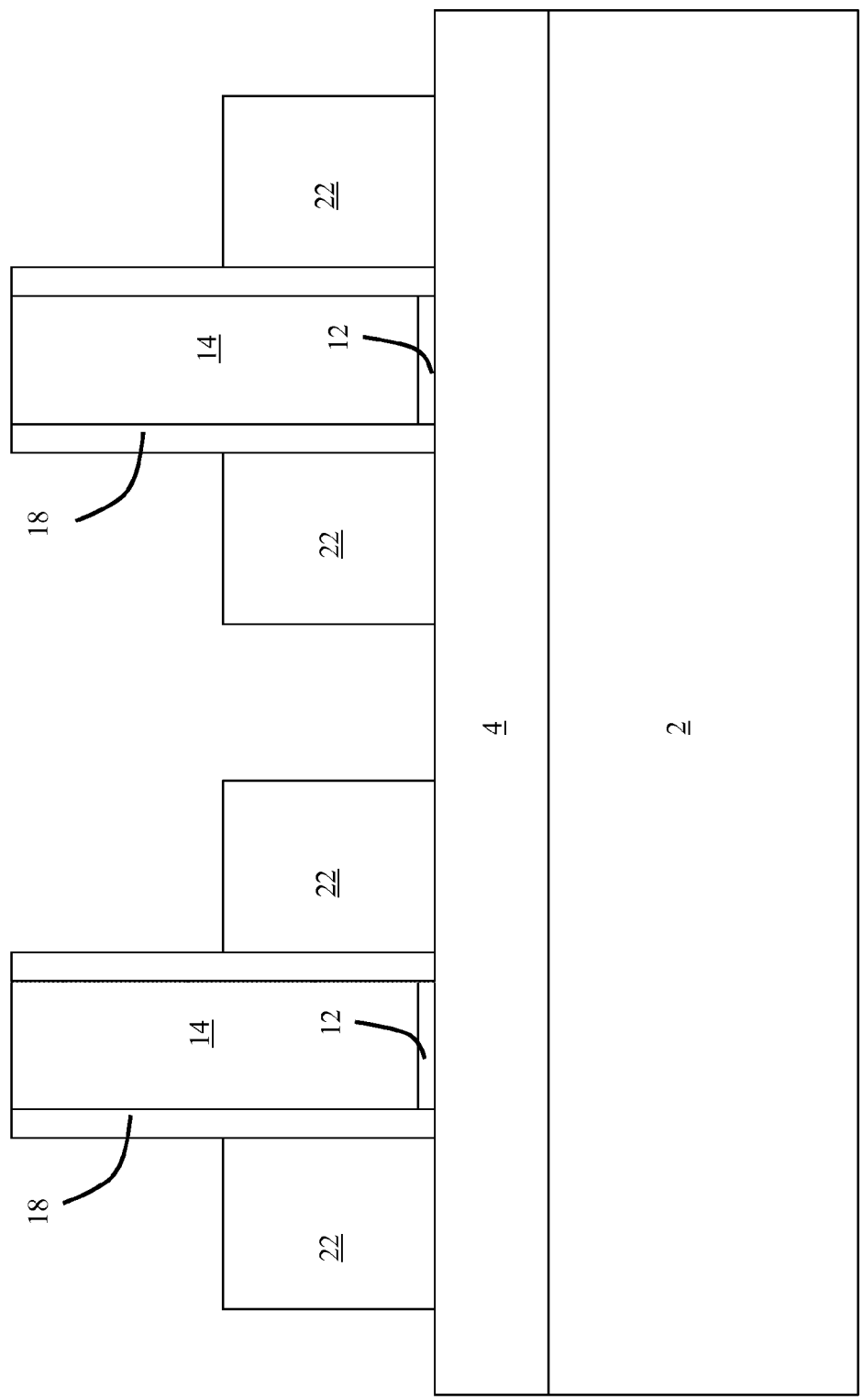

FIGS. 6A-6C illustrate a process according to various embodiments of the invention, which can include forming a dummy epitaxy layer 22 between the fins 8 in the set of fins, the dummy epitaxy layer 22 contacting the exposed sidewalls 15 (FIG. 5A) of each exposed fin 8. The dummy epitaxy layer 22 can be formed of, e.g., an undoped silicon germanium (SiGe). In some cases, the dummy epitaxy layer 22 can be formed of a single dummy epitaxy layer, which can later be recessed in the gap 9 between the sets of fins 8.

Figure 7A:
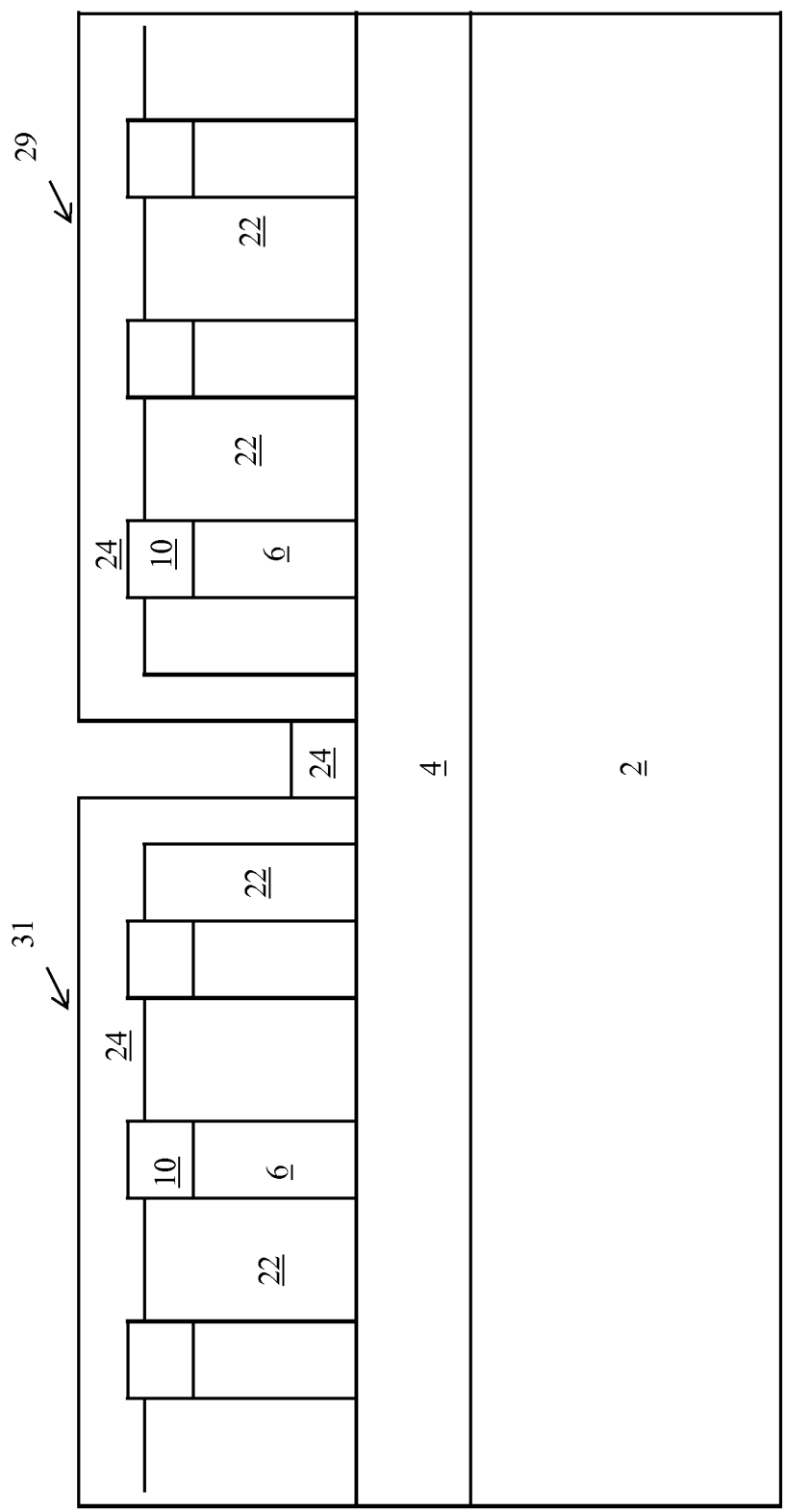
Figure 7B:
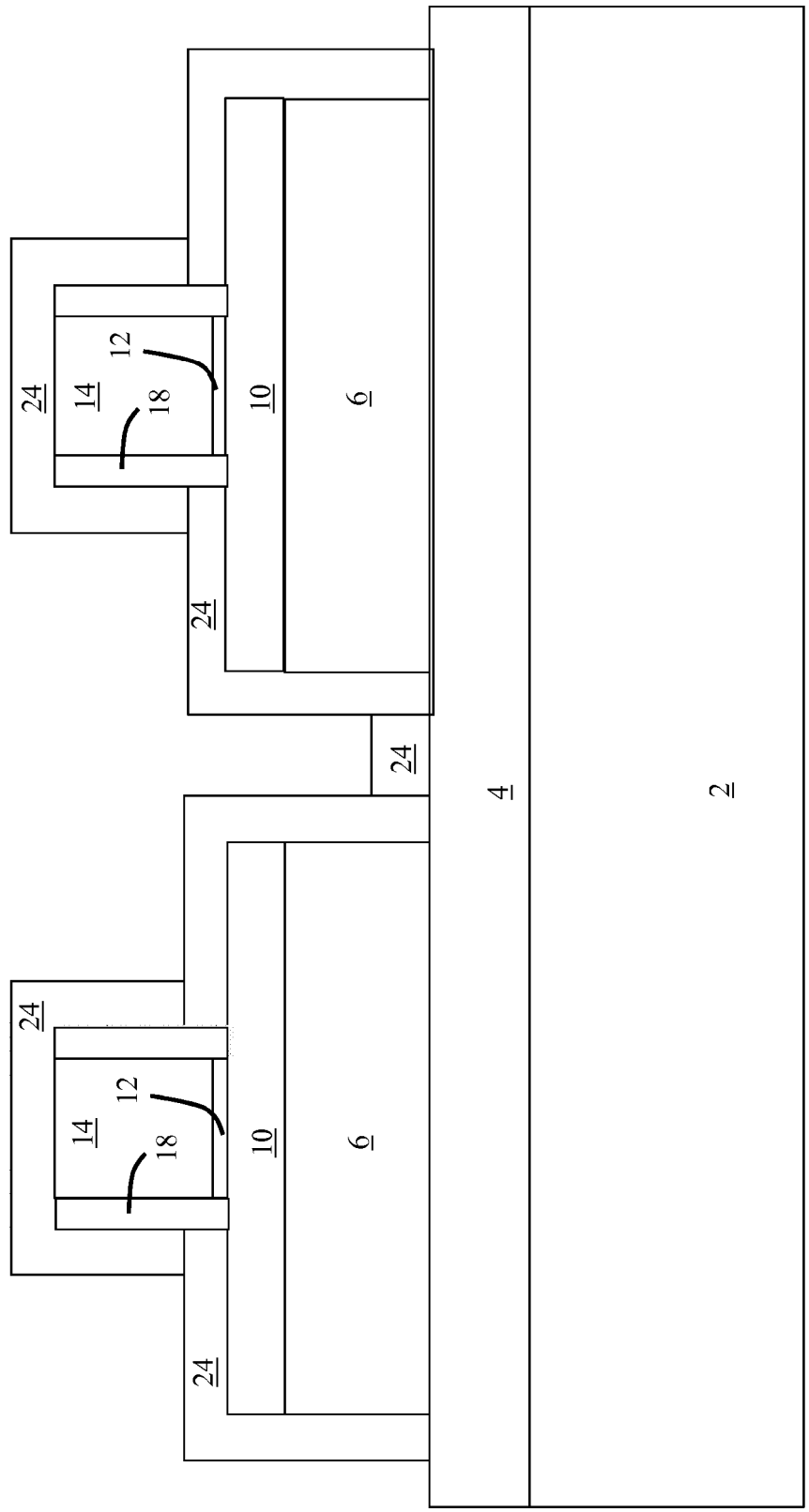
Figure 7C:
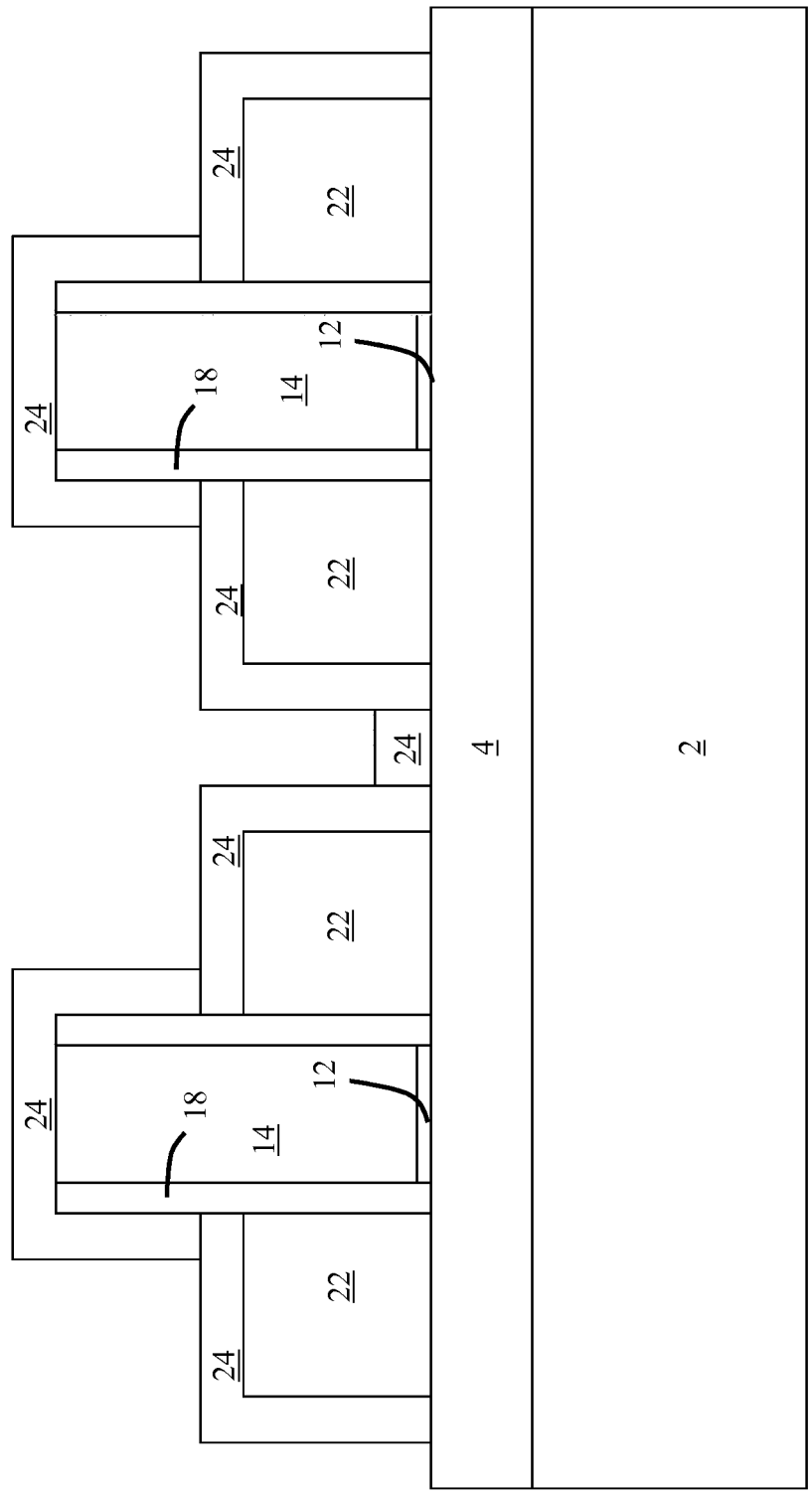

FIGS. 7A-7C illustrate a process according to various embodiments of the invention, which can include forming a dielectric 24 over the dummy epitaxy layer 22 and the set of fins 8. The dielectric 24 can include any conventional dielectric material (e.g., including silicon), and can be formed (e.g., deposited) in a substantially blanket fashion over the dummy epitaxy layer 22 and the set of fins 8. The dielectric 24 can be referred to herein as having a first portion 29 and a second portion 31, which merely denote their orientations with respect to the underlying semiconductor components (e.g., field effect transistor, or FET components). In various embodiments, the first portion 29 of the dielectric 24 overlies an nFET region of the substrate 2, and the second portion 31 of the dielectric 24 overlies a pFET region of the substrate 2.

Figure 8A:
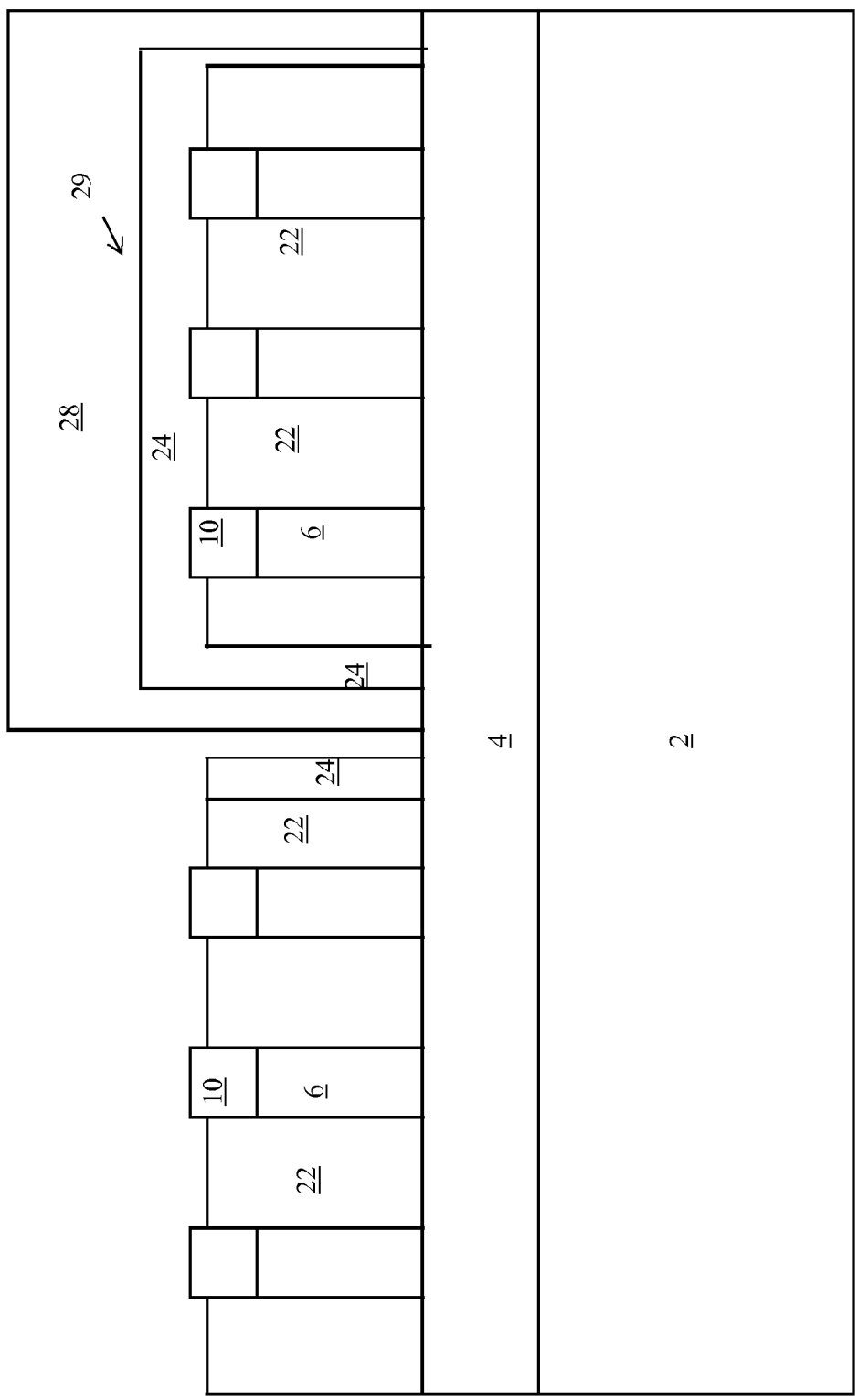
Figure 8B:
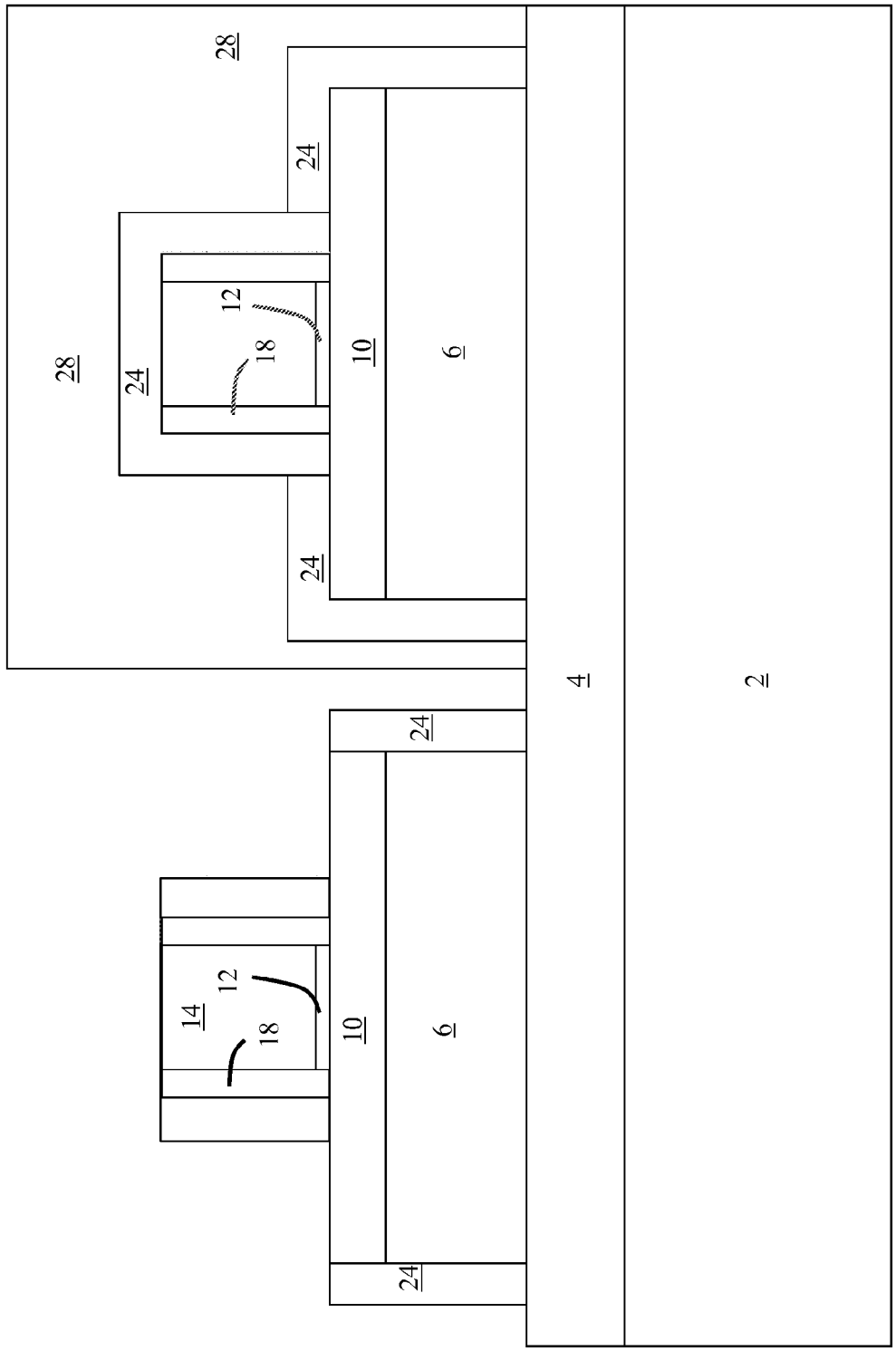
Figure 8C:
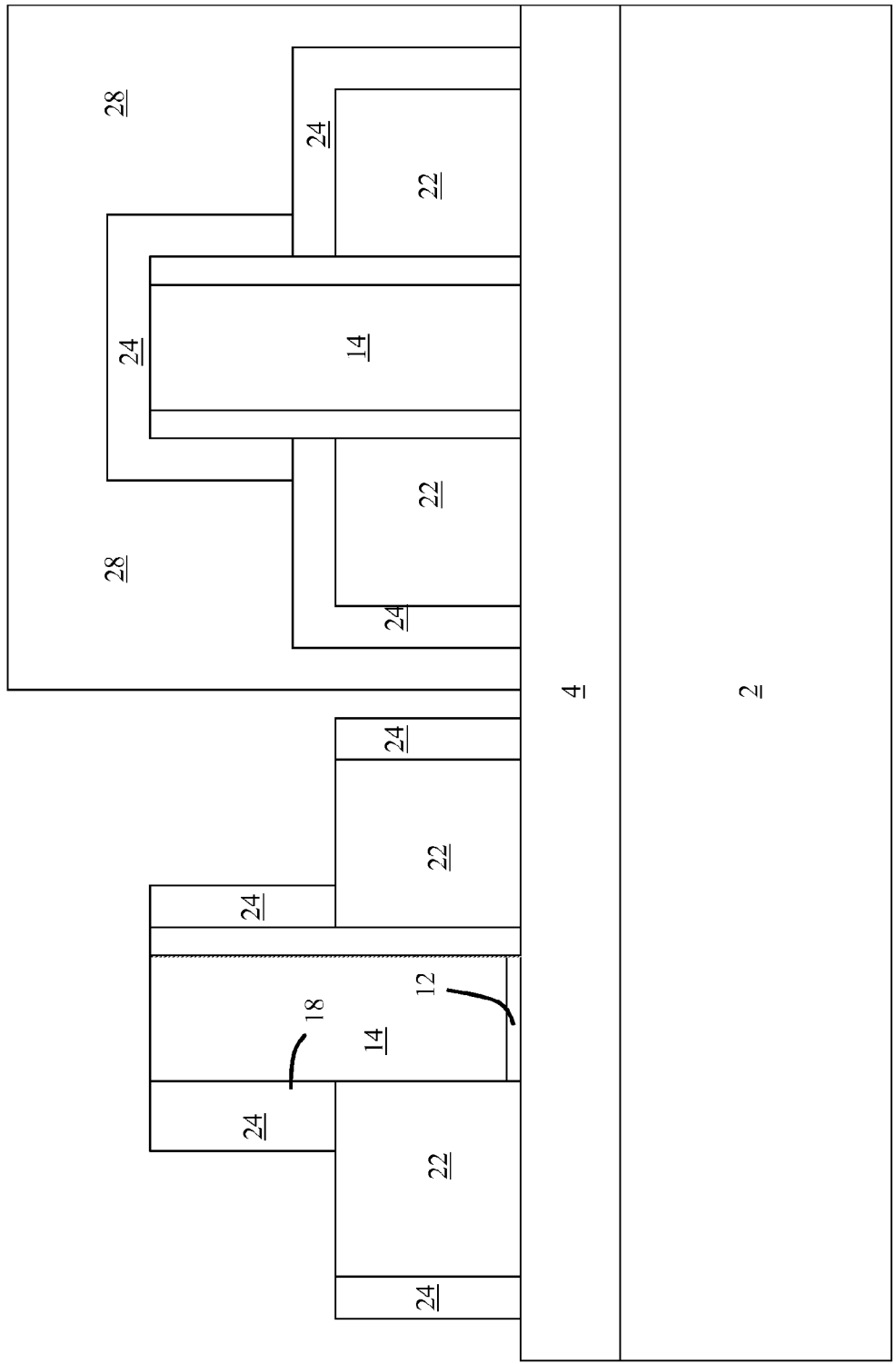

FIGS. 8A-8C illustrate a process according to various embodiments of the invention, which can include forming a first mask 28 over the first portion 29 of the dielectric 24. The mask 28 can be formed of any conventional mask material known in the art, and can be selectively formed over the first portion 29 of the dielectric 24. In some cases, the mask 28 is formed such that the second portion 31 (FIG. 7A) of the dielectric 24 is exposed.

Figure 9A:
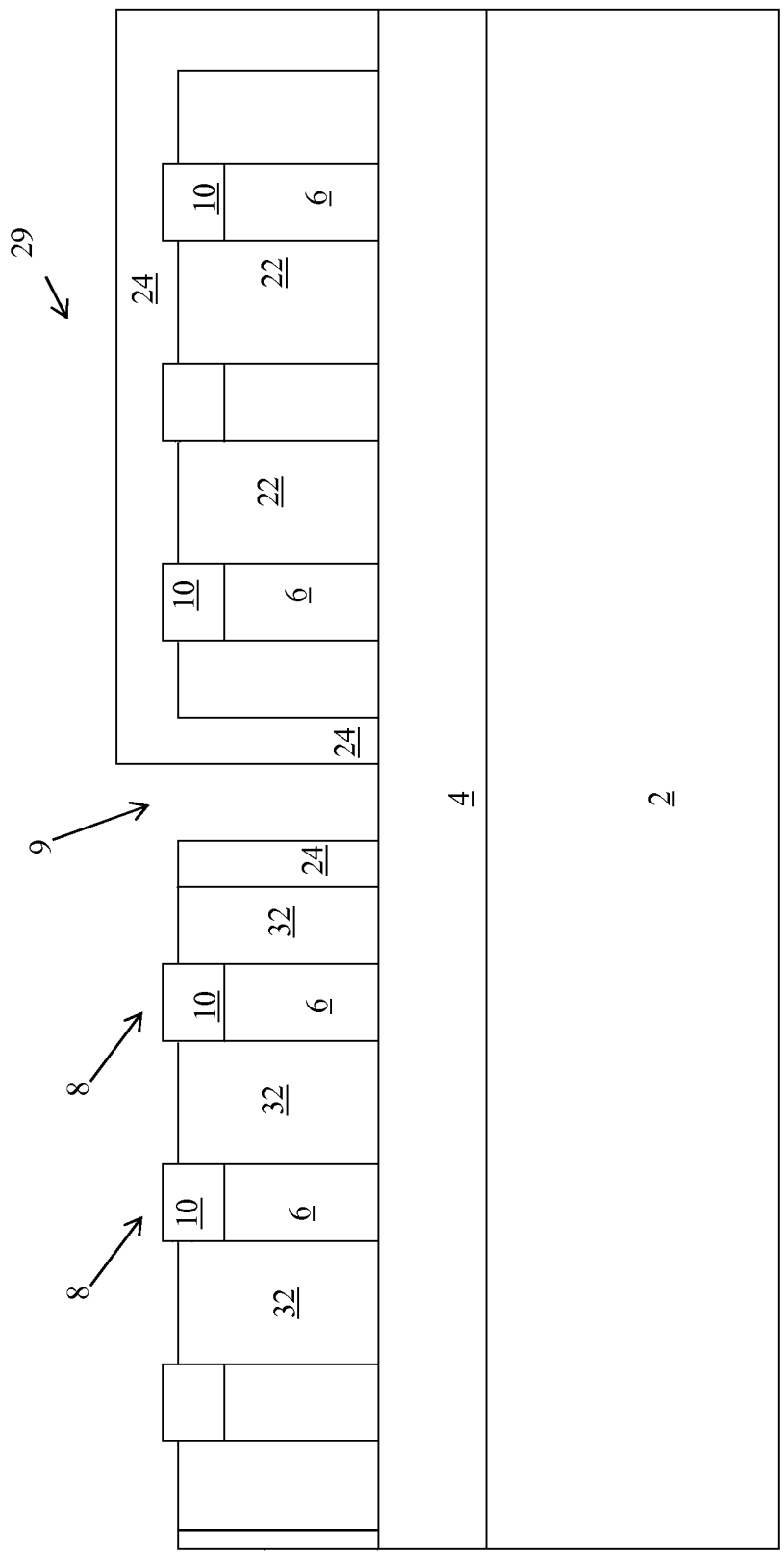
Figure 9B:
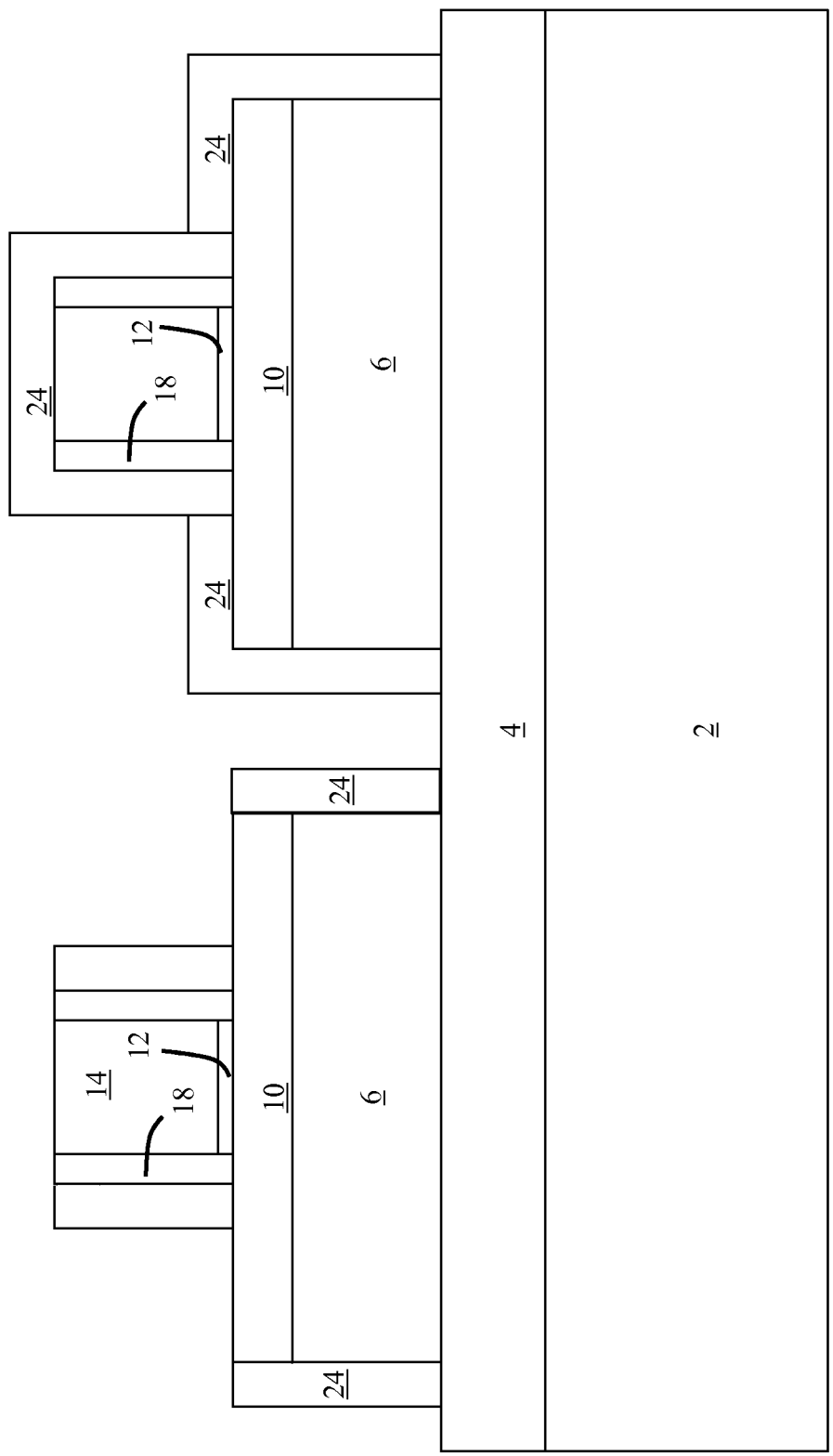
Figure 9C:
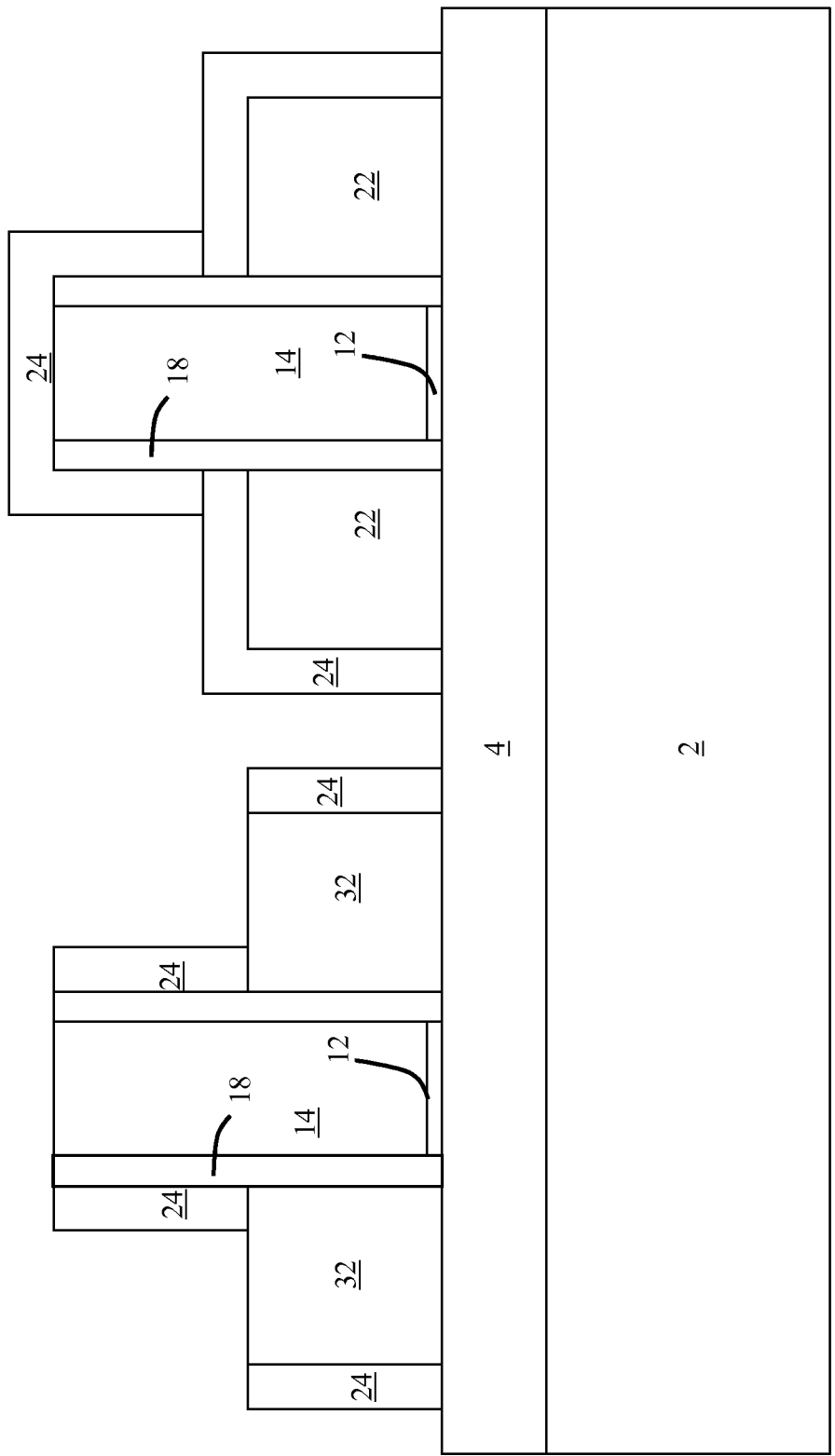

FIGS. 8A-8C and 9A-9C illustrate a process according to various embodiments of the invention, which can include removing the second portion 31 (FIG. 7A) of the dielectric 24 and the dummy epitaxy layer 22 under the second portion 31 of the dielectric 24 to expose fins 8 under the second portion 31 of the dielectric 24. The dummy epitaxy layer 22 (e.g., SiGe) can be removed using a wet etch process in some embodiments. In various embodiments, the wet etch composition includes $H_2O_2$. In some embodiments the wet etch composition includes $H_2O_2$, $NH_4OH$ and water. In other cases, the dummy epitaxy layer 22 can be removed in a gas mixture containing HCl. In this case, the dummy epitaxy layer 22 is etched in an HCl-containing gas mixture, using an epitaxy tool, prior to epitaxial growth of the in-situ doped epitaxy 32. FIGS. 9A-9C illustrate an additional process including forming a first in-situ doped epitaxy 32 between the exposed fins 8. It is understood that FIGS. 8A-8C and 9A-9C do not depict the exposed fins 8, as the depiction in FIGS. 9A-9C shows the first in-situ doped epitaxy 32 already formed between the fins 8. The first in-situ doped epitaxy 32 may be epitaxially grown in the space between fins 8, or alternatively, deposited between the fins 8, and subsequently doped (e.g., p-type doped or n-type doped).

Figure 10A:
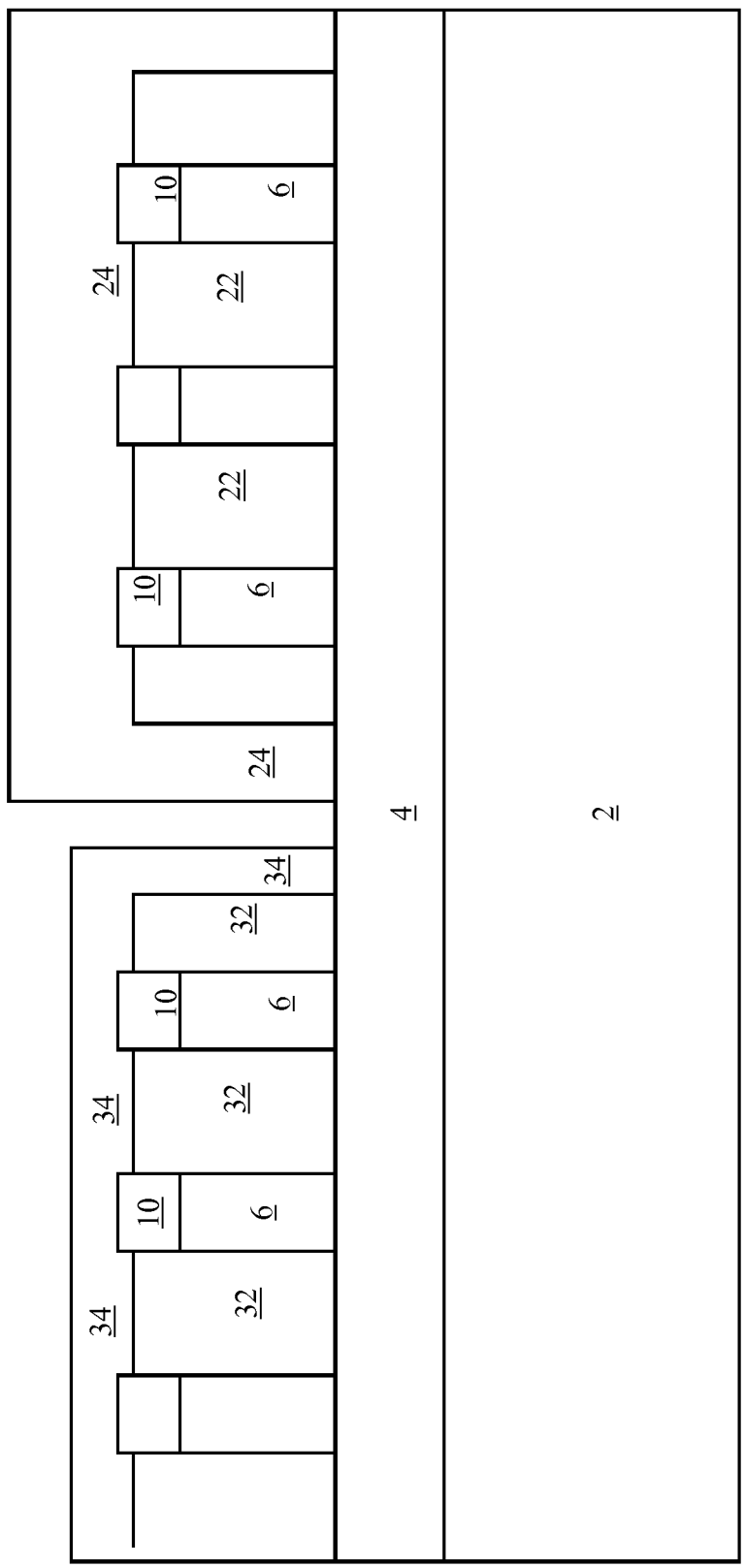
Figure 10B:
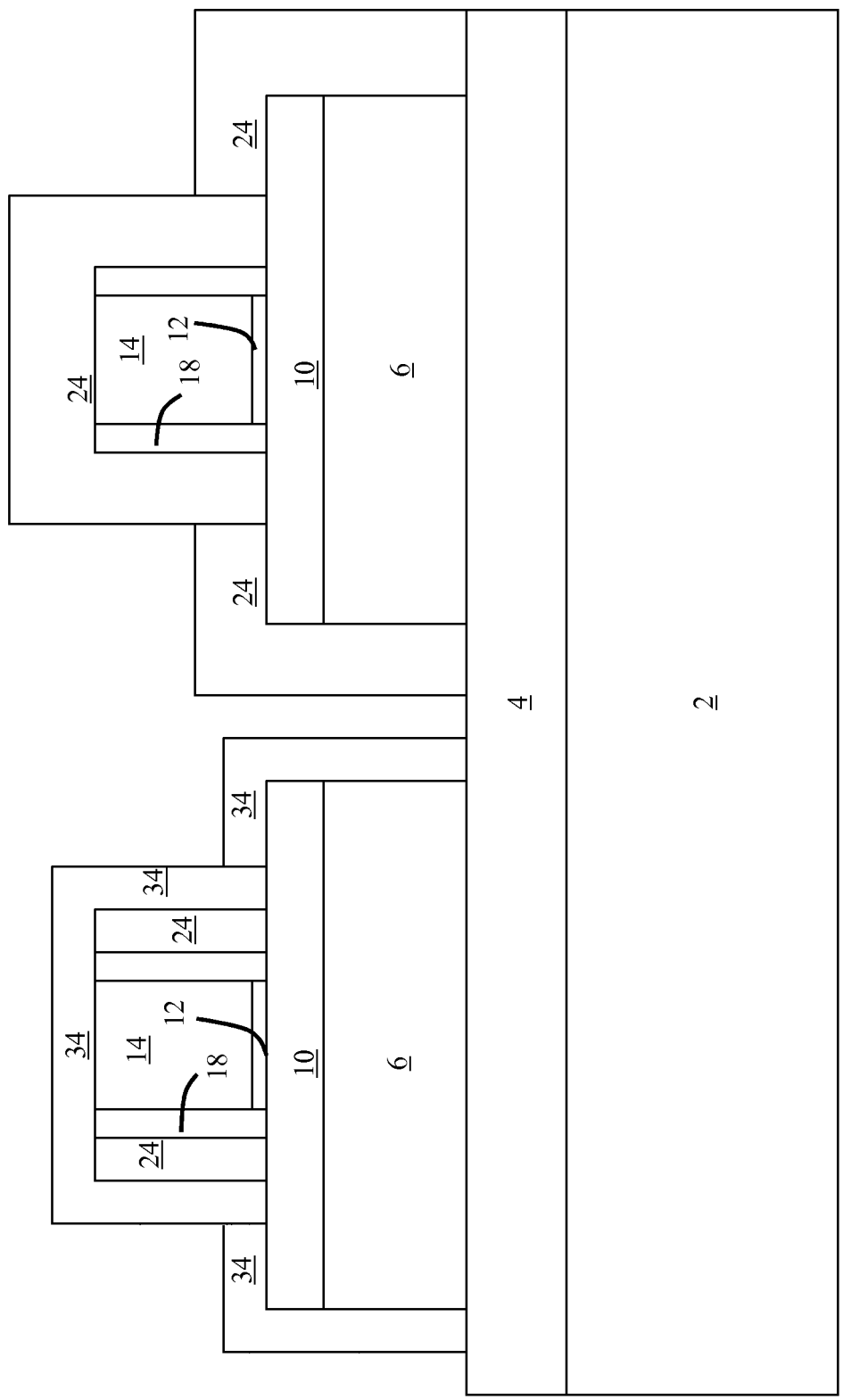
Figure 10C:
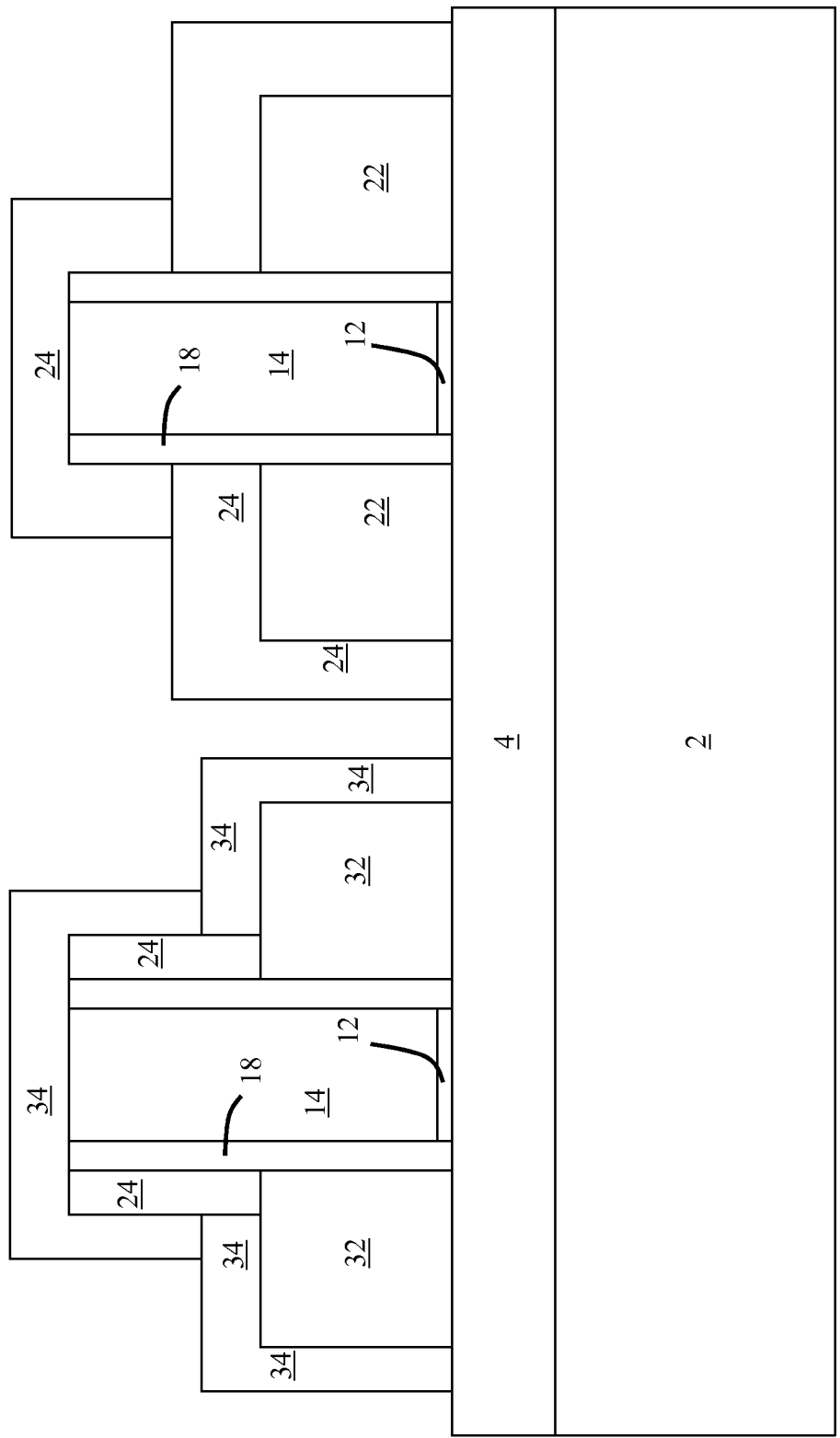

FIGS. 10A-10C illustrate a process according to various embodiments of the invention, which can include forming a shielding dielectric 34 over the first in-situ doped epitaxy 32 and the exposed fins 8. The shielding dielectric 34 can include any conventional dielectric material, and can be deposited (e.g., blanket deposited) over the first in-situ doped epitaxy 32 and the (previously) exposed fins 8.

Figure 11A:
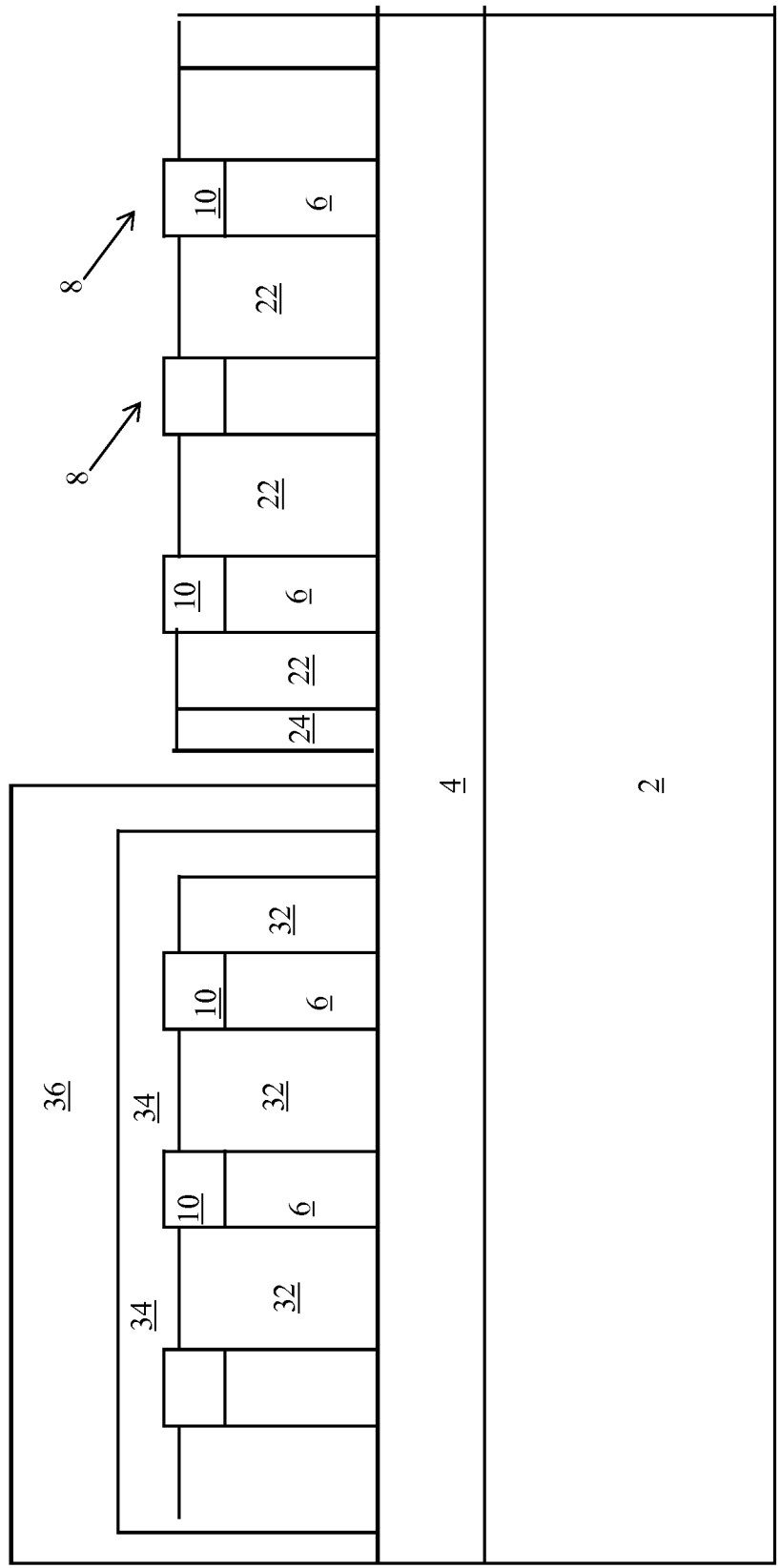
Figure 11B:
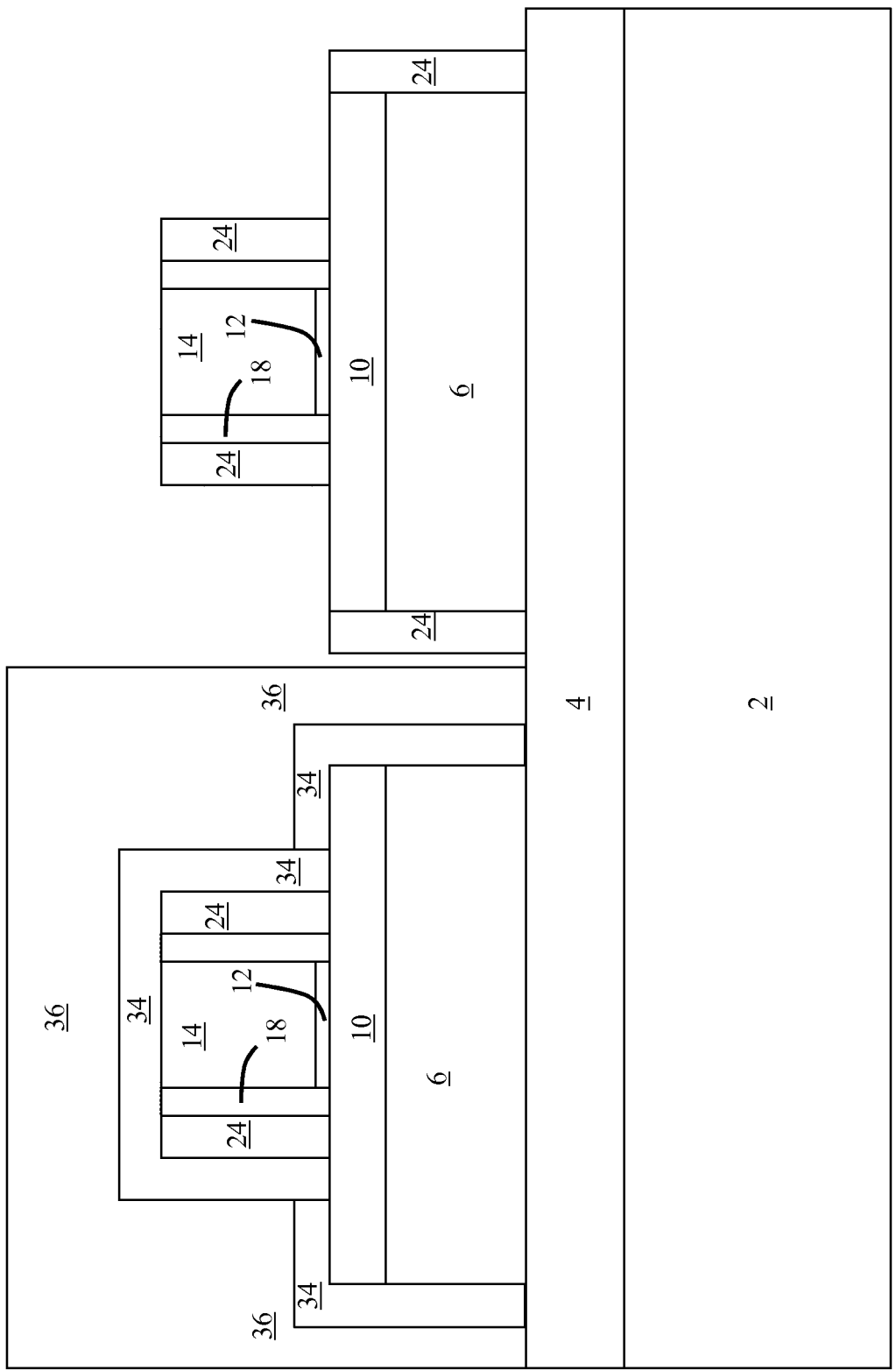
Figure 11C:
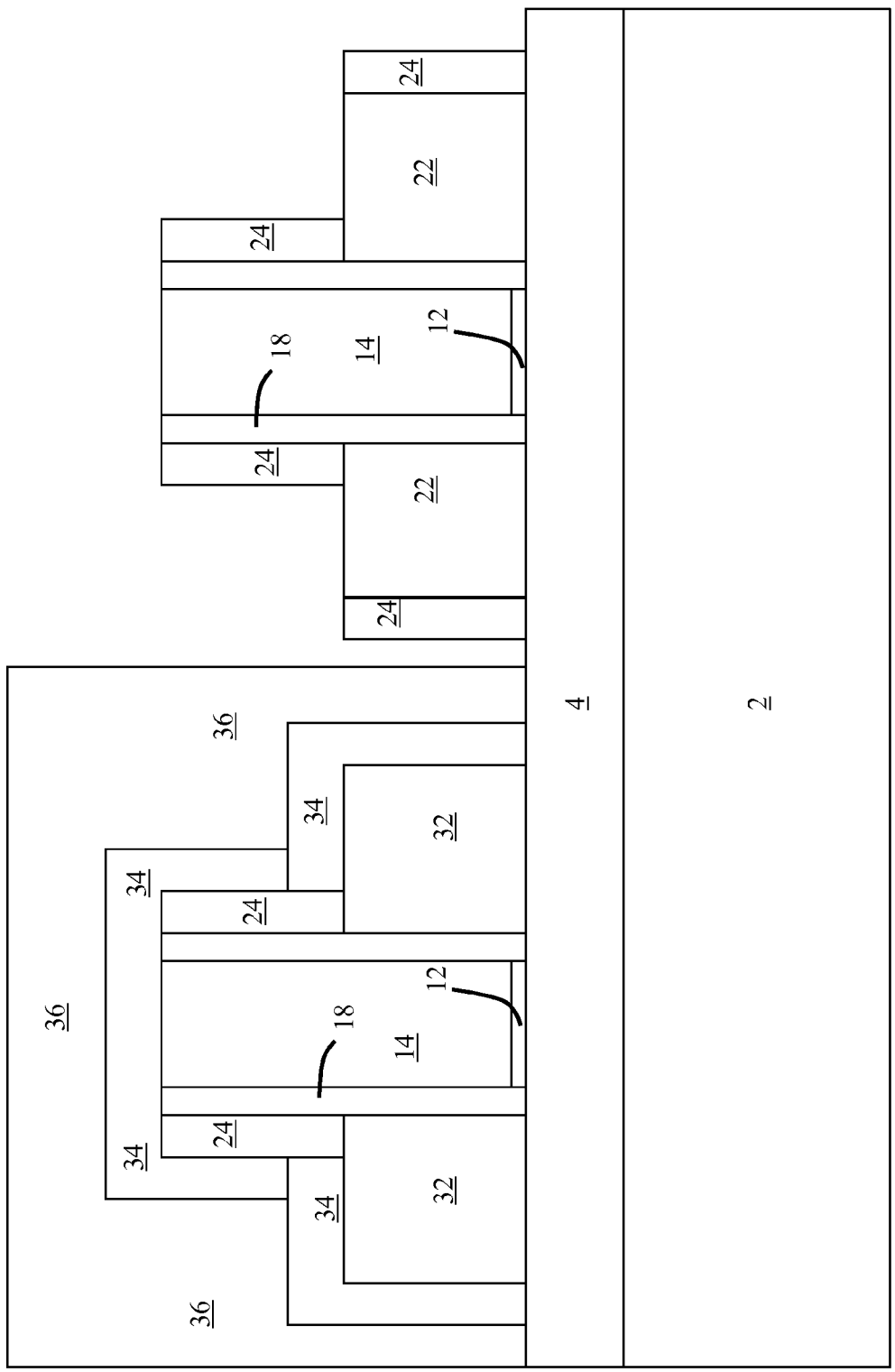

FIGS. 11A-11C illustrate a process according to various embodiments of the invention, which can include forming a second mask 36 over the shielding dielectric 34. The second mask 36 can be formed of any conventional mask material known in the art, and can be selectively formed over the first portion shielding dielectric 34. Also shown in FIGS. 11A-11C, a further process can include removing the first portion 29 of the dielectric 24, e.g., using the second mask 36 to shield the underlying shielding dielectric 34 and first in-situ doped epitaxy 32. It is understood that in some embodiments, the first mask 28 can be removed before the second mask 36 is formed.

Figure 12A:
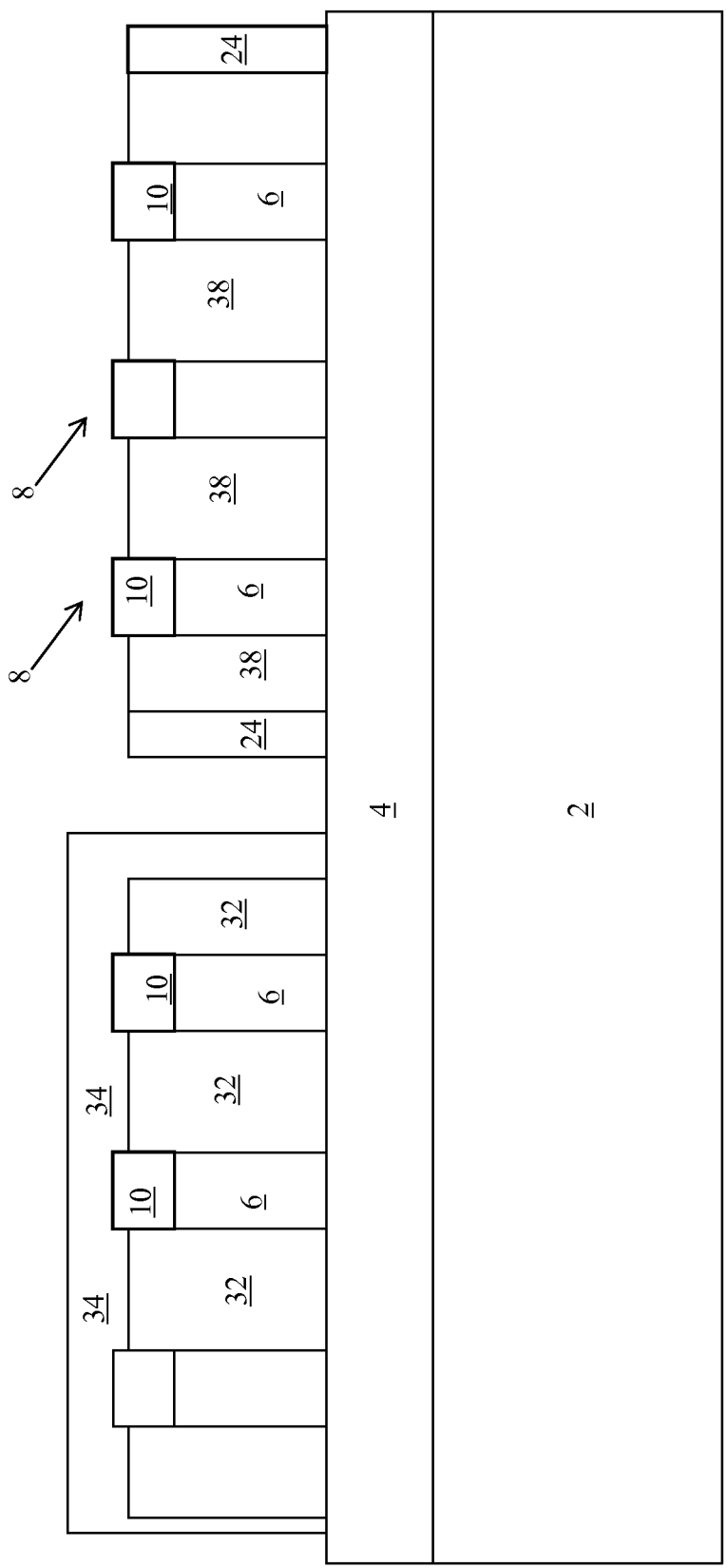
Figure 12B:
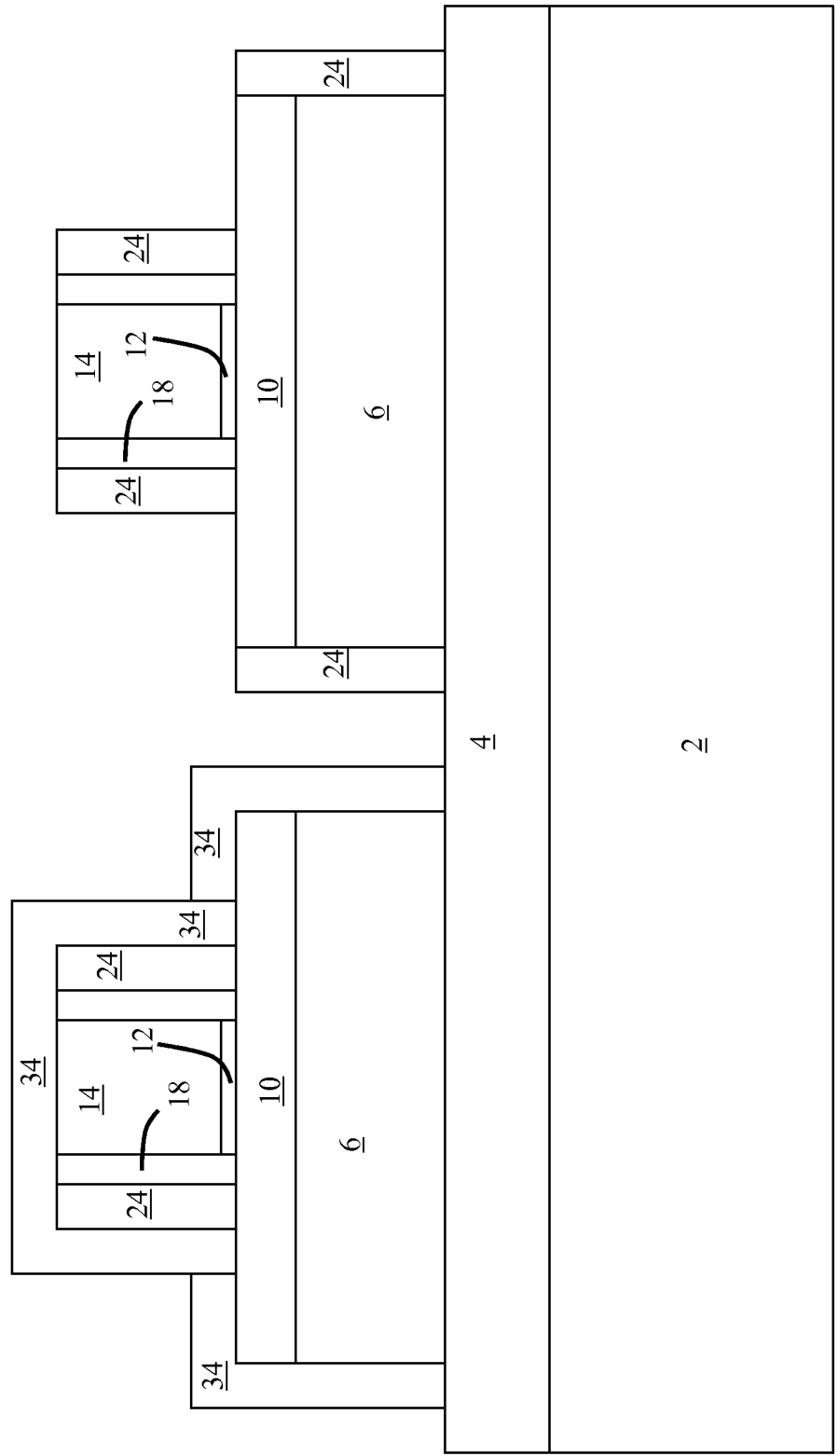
Figure 12C:
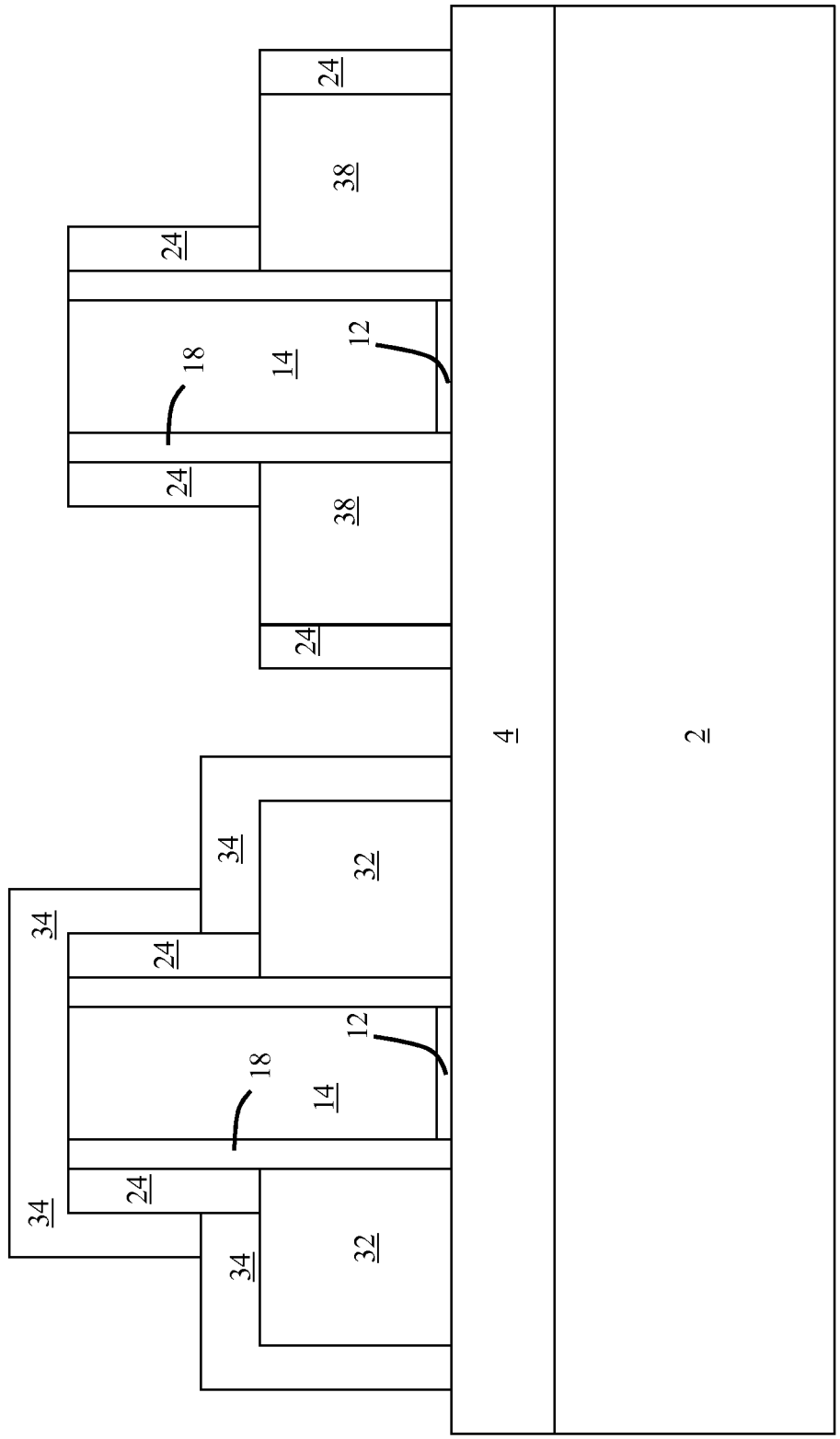
Figure 13A:
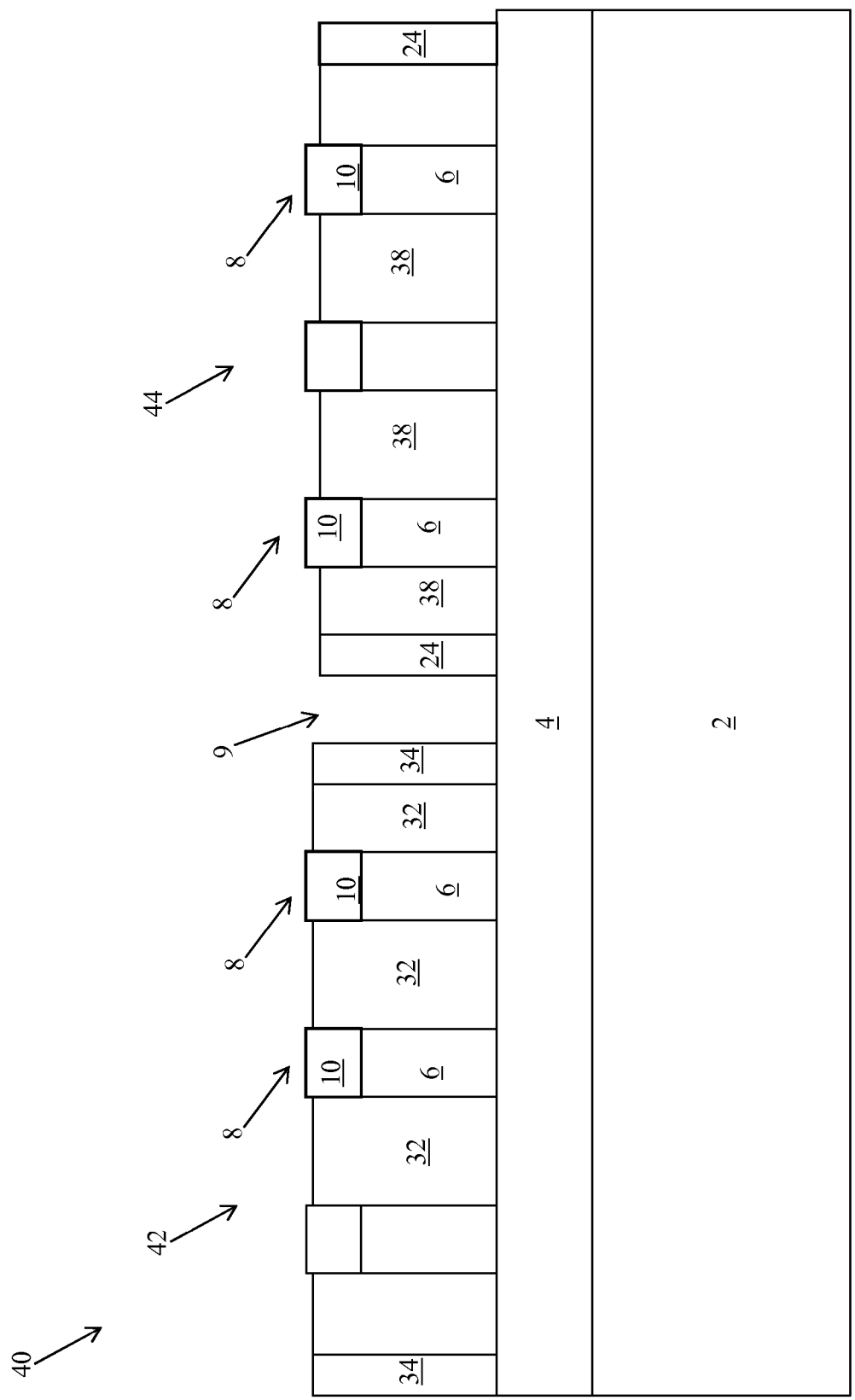
FIGS. 13A-13C depict a semiconductor structure formed according to various embodiments of the invention.
Figure 13B:
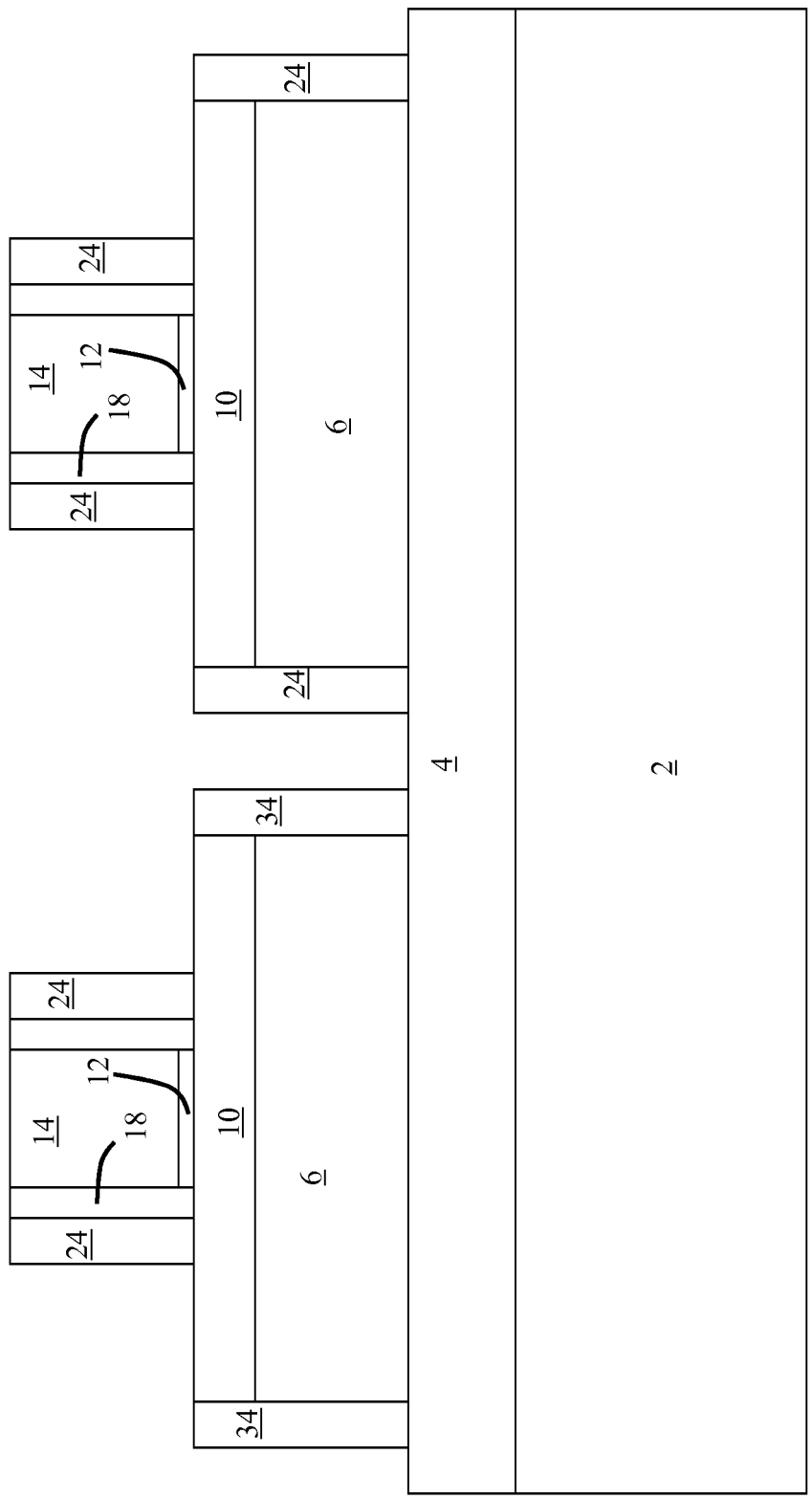
Figure 13C:
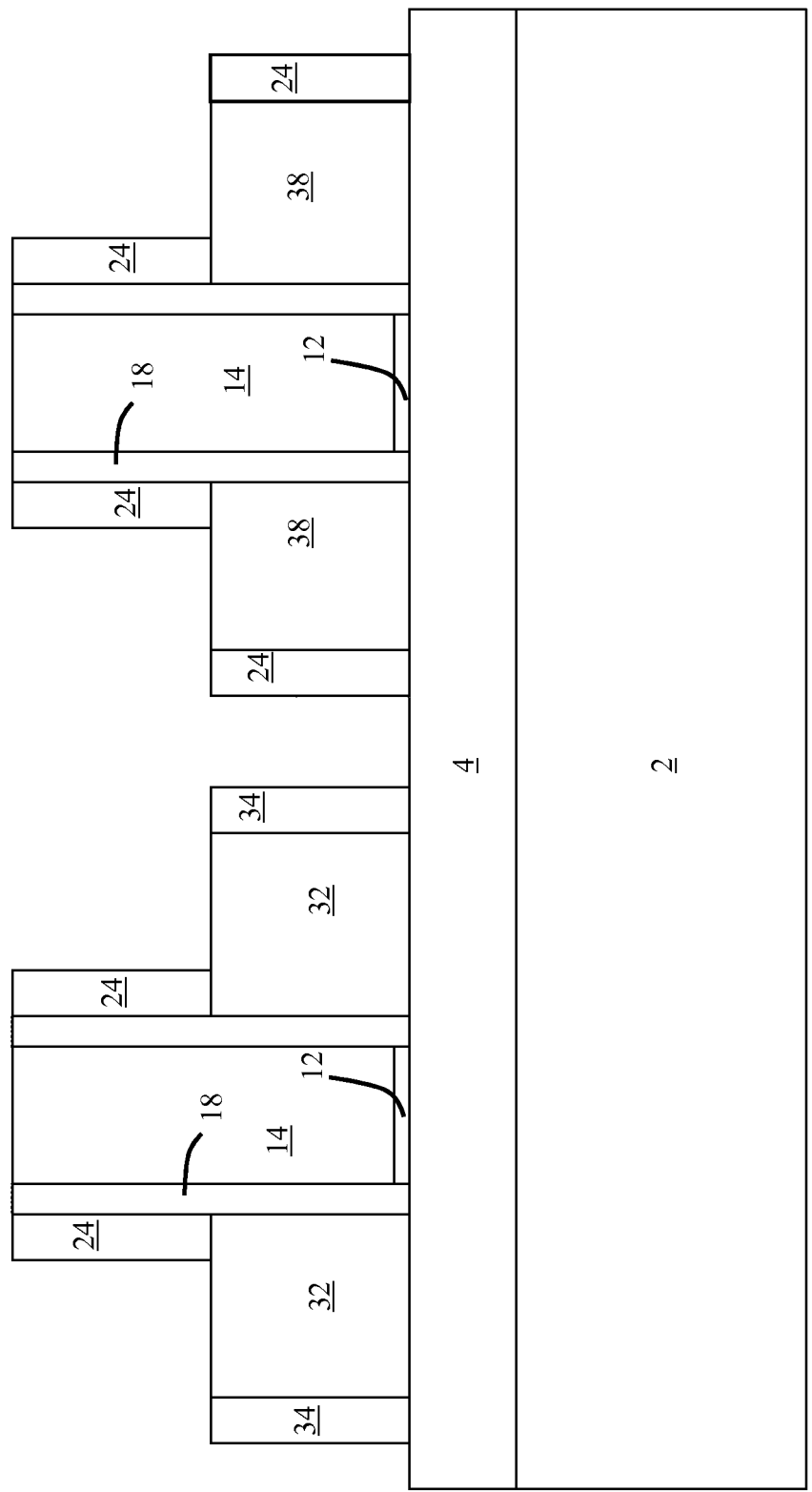

FIGS. 12A-12C illustrate a process according to various embodiments of the invention, which can include removing the dummy epitaxy layer 22 under the first portion 29 (FIG. 9A) of the dielectric 24 to expose fins 8 under the first portion 29 of the dielectric 24, and forming a second in-situ doped epitaxy 38 between the exposed fins 8 under the first portion of the dielectric 29 (FIG. 9A);

FIGS. 13A-13C illustrate another process according to various embodiments of the invention, which can include removing the shielding dielectric 34 over the first in-situ doped epitaxy 32 and the exposed fins 8. The shielding dielectric 34 can be removed using conventional removal techniques, e.g., masking and etching.

As shown in FIGS. 13A-13C, a semiconductor structure 40 is formed from the herein-noted processes, such that the semiconductor structure 40 includes two distinct in-situ doped epitaxy types (e.g., first in-situ doped epitaxy 32 and second in-situ doped epitaxy 38). In some cases, the first in-situ doped epitaxy 32 is formed including a p-type dopant, and that portion of the semiconductor structure 40 includes a p-type FET (pFET) region 42. In this case, the second in-situ doped epitaxy 38 can be formed including an n-type dopant, and that portion of the semiconductor structure 40 can include an n-type FET (nFET) region 44. It is understood that this orientation could be swapped in some embodiments. In any case, the first in-situ doped epitaxy 32 has a distinct dopant type from the second in-situ doped epitaxy 38. As shown, the pFET 42 and nFET 44 can be separated by the gap 9 described herein.

It is further understood that according to various embodiments of the invention, the forming of at least one of the first dummy epitaxy layer 22 or the second dummy epitaxy layer 22 includes depositing an undoped SiGe between the fins 8 in the set of fins 8.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
   providing a precursor structure including a substrate and a set of fins overlying the substrate;
   forming a dummy epitaxy layer between the fins in the set of fins;
   forming a dielectric over the dummy epitaxy layer and the set of fins;
   forming a first mask over a first portion of the dielectric, leaving a second portion of the dielectric exposed;
   removing the second portion of the dielectric and the dummy epitaxy layer under the second portion of the dielectric to expose fins under the second portion of the dielectric;
   forming a first an in-situ doped epitaxy between the exposed fins;
   forming a shielding dielectric over the in-situ doped epitaxy and the exposed fins;
   forming a second mask over the shielding dielectric;
   removing the first portion of the dielectric and the dummy epitaxy layer under the first portion of the dielectric to expose fins under the first portion of the dielectric;
   forming a second in-situ doped epitaxy between the exposed fins under the first portion of the dielectric; and
   removing the shielding dielectric over the in-situ doped epitaxy and the exposed fins.

2. The method of claim 1, wherein the forming of the dummy epitaxy layer between the fins in the set of fins includes forming the dummy epitaxy layer to contact exposed sidewalls of each of the set of fins.

3. The method of claim 1, wherein the providing of the precursor structure includes:
   forming the set of fins over a substrate;
   forming a hard mask over each fin in the set of fins;
   forming a gate stack over the hard mask, the set of fins and the exposed portion of the substrate; and
   selectively forming a spacer structure over sidewalls of the gate stack, leaving sidewalls of each fin exposed.

4. The method of claim 3, wherein the substrate includes one of a silicon-on-insulator (SOI) semiconductor structure having: a substrate; a buried oxide layer over the substrate; and an SOI layer over the buried oxide layer, or a bulk silicon.

5. The method of claim 4, wherein the forming of the fins includes forming the fins from the SOI layer to expose a portion of the buried oxide layer prior to the forming of the hard mask over each fin in the set of fins.

6. The method of claim 5, wherein the selectively forming of the spacer structure includes forming a spacer layer over the sidewalls of the gate stack and the fins, and removing the spacer layer over the sidewalls of each fin.

7. The method of claim 1, further comprising removing a fin in the set of fins to form two sub-sets of fins prior to the forming of the gate stack.

8. The method of claim 1, wherein the first in-situ doped epitaxy has a distinct dopant type from the second in-situ doped epitaxy.

9. The method of claim 1, further comprising removing the first mask before the forming of the second mask.

10. The method of claim 1, wherein the first portion of the dielectric overlies an NFET region of the substrate, and wherein the second portion of the dielectric overlies a PFET region of the substrate.

11. The method of claim 1, wherein the forming of at least one of the first dummy epitaxy layer or the second dummy epitaxy layer includes depositing an undoped SiGe between the fins in the set of fins.

12. A method comprising:
providing a precursor structure including a substrate and a set of fins overlying the substrate;
forming a dummy epitaxy between the fins in the set of fins;
masking a first group of fins in the set of fins and the dummy epitaxy between the first group of fins in the set of fins;
removing the dummy epitaxy to expose a second group of the fins;
forming a first in-situ doped epitaxy between the exposed fins;
masking the second group of fins in the set of fins and the in-situ doped epitaxy between the second group of fins in the set of fins;
unmasking the first group of fins;
removing the dummy epitaxy layer between the first group of fins to expose of the first group of fins; and
forming a second in-situ doped epitaxy between the exposed fins.

13. The method of claim 12, wherein the masking of the first group of fins includes:
forming a dielectric over the dummy epitaxy layer and the set of fins; and
forming a first mask over a first portion of the dielectric, leaving a second portion of the dielectric exposed.

14. The method of claim 13, wherein the masking of the second group of fins includes:
forming a second mask over the second portion of the dielectric, leaving the first portion of the dielectric exposed.

15. The method of claim 13, wherein the providing of the precursor structure includes:
forming the set of fins over a substrate;
forming a hard mask over each fin in the set of fins;
forming a gate stack over the hard mask, the set of fins and the exposed portion of the buried oxide layer; and
selectively forming a spacer structure over sidewalls of the gate stack, leaving sidewalls of each fin exposed.

16. The method of claim 15, wherein the substrate includes one of a silicon-on-insulator (SOI) semiconductor structure having: a substrate; a buried oxide layer over the substrate; and an SOI layer over the buried oxide layer, or a bulk silicon.

17. The method of claim 16, wherein the forming of the fins includes forming the fins from the SOI layer to expose a portion of the buried oxide layer prior to the forming of the hard mask over each fin in the set of fins.

18. The method of claim 12, wherein the forming of the dummy epitaxy layer between the fins in the set of fins includes forming the dummy epitaxy layer to contact exposed sidewalls of each of the plurality of fins.

19. The method of claim 12, wherein the first in-situ doped epitaxy has a distinct dopant type from the second in-situ doped epitaxy.

20. A method comprising:
forming a set of fins over a substrate;
forming a gate stack over the set of fins;
selectively forming a spacer structure over sidewalls of the gate stack, leaving sidewalls of each fin exposed;
forming a dummy epitaxy layer between the fins in the set of fins, the dummy epitaxy layer contacting the exposed sidewalls of each exposed fin;
forming a dielectric over the dummy epitaxy layer and the set of fins;
forming a first mask over a first portion of the dielectric, leaving a second portion of the dielectric exposed;
removing the second portion of the dielectric and the dummy epitaxy layer under the second portion of the dielectric to expose fins under the second portion of the dielectric;
forming a first an in-situ doped epitaxy between the exposed fins;
forming a shielding dielectric over the in-situ doped epitaxy and the exposed fins;
forming a second mask over the shielding dielectric;
removing the first portion of the dielectric and the dummy epitaxy layer under the first portion of the dielectric to expose fins under the first portion of the dielectric;
forming a second in-situ doped epitaxy between the exposed fins under the first portion of the dielectric; and
removing the shielding dielectric over the in-situ doped epitaxy and the exposed fins.

* * * * *